(12) United States Patent
Inoue et al.

(10) Patent No.: US 6,872,989 B2
(45) Date of Patent: Mar. 29, 2005

(54) SEMICONDUCTOR DEVICE AND METHOD FOR FABRICATING THE SAME

(75) Inventors: Akira Inoue, Kadoma (JP); Takeshi Takagi, Kyoto (JP); Yoshihiro Hara, Hirakata (JP); Minoru Kubo, Nabari (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/370,766

(22) Filed: Feb. 24, 2003

(65) Prior Publication Data

US 2003/0201497 A1 Oct. 30, 2003

Related U.S. Application Data

(62) Division of application No. 10/311,292, filed as application No. PCT/JP02/03365 on Apr. 3, 2002.

(51) Int. Cl.$^7$ ............................................. H01L 31/0312
(52) U.S. Cl. ............................................................ 257/192
(58) Field of Search .............................. 257/183, 190, 257/192, 194, 241, 287, 288, 616; 438/E29.263

(56) References Cited

U.S. PATENT DOCUMENTS

| | | | | |
|---|---|---|---|---|
| 5,780,899 A | * | 7/1998 | Hu et al. | 257/335 |
| 5,847,419 A | * | 12/1998 | Imai et al. | 257/192 |
| 6,310,367 B1 | * | 10/2001 | Yagishita et al. | 257/190 |
| 2004/0036113 A1 | * | 2/2004 | Ueno | 257/329 |

FOREIGN PATENT DOCUMENTS

| | | | |
|---|---|---|---|
| EP | 829908 A2 | * 3/1998 | ......... H01L/29/778 |
| EP | 110237 A | 5/2001 | |
| GB | 2332983 A | 7/1999 | |
| JP | 1-140632 A | 6/1989 | |
| JP | 3-22430 A | 1/1991 | |
| JP | 6-291253 A | 10/1994 | |
| JP | 8-335676 A | 12/1996 | |
| JP | 10-41515 A | 2/1998 | |
| JP | 11-233733 A | 8/1999 | |
| JP | 2000-91576 A | 3/2000 | |
| WO | WO 00/32516 A1 | 6/2000 | |

OTHER PUBLICATIONS

"A Dynamic Threshold Voltage MOSFET (DTMOS) for Ultra–Low Voltage Operation", F. Assaderaghi et al., 1994 IEEE, pp. 33.1.1–33.1.4.

* cited by examiner

*Primary Examiner*—Carl Whitehead, Jr.
*Assistant Examiner*—Jennifer M. Dolan
(74) *Attorney, Agent, or Firm*—McDermott Will & Emery LLP

(57) ABSTRACT

A silicon oxide film 102, a Pt film 103x, a Ti film 104x and a PZT film 105x are deposited in this order over a Si substrate 101. The Si substrate 101 is placed in a chamber 106 so that the PZT film 105x is irradiated with an EHF wave 108. The irradiation with the EHF wave locally heats a dielectric film such as the PZT film. As a result, it is possible to improve, for example, the leakage property of the dielectric film without adversely affecting a device formed on the Si substrate 101.

10 Claims, 21 Drawing Sheets n-HDTMOS p-HDTMOS

FIG. 16(a)
FIG. 16(b)
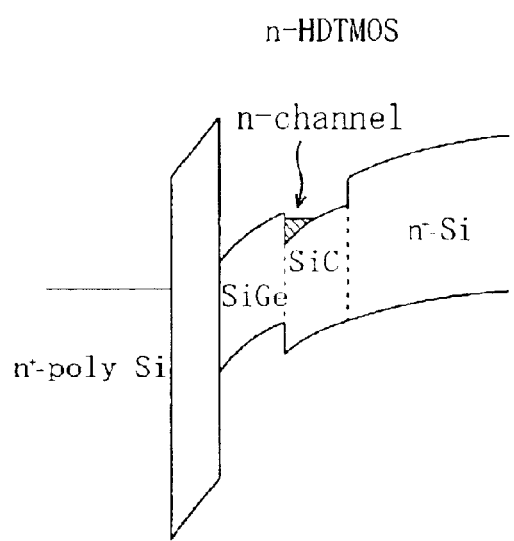
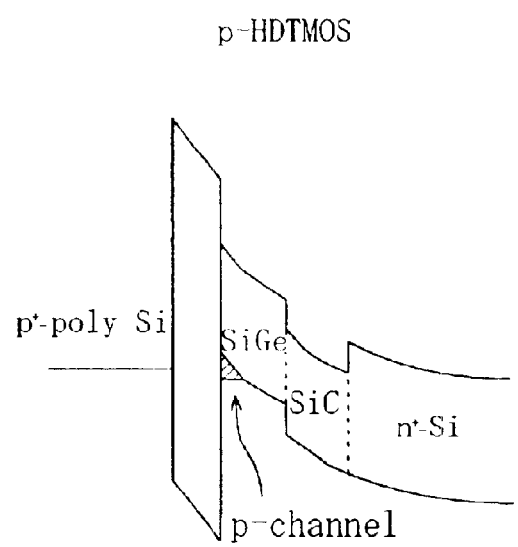

SEMICONDUCTOR DEVICE AND METHOD FOR FABRICATING THE SAME

This application is a divisional of application Ser. No. 10/311,292 filed Dec. 17, 2002, which is a 371 of PCT/JP02/03365, filed Apr. 3, 2002.

TECHNICAL FIELD

The present invention relates to semiconductor devices functioning as MIS transistors or memory cell transistors including dielectric films and methods for fabricating the same.

BACKGROUND ART

Recently, miniaturization of semiconductors has progressed, and attempts are being made to use, as a material for gate insulating films of transistors or for capacitive films of DRAMs, dielectric materials with a higher dielectric constant instead of, for example, silicon oxide that has been conventionally used. In addition, ferroelectric memories provided with ferroelectric films for memory capacitors in memory cells have been put into practical use as new nonvolatile memories.

High-dielectric-constant or ferroelectric films used for the semiconductor devices have been conventionally formed by the following manner. First, as an underlying layer, a film having a crystal orientation is formed over a substrate. Next, a high-dielectric-constant or ferroelectric film is deposited by a process such as a sputtering process or a chemical vapor deposition process using an organic metal complex (an MOCVD process). In this case, to obtain a film with high crystallinity, a substrate temperature is kept at 650° C. or more during the deposition, or heat treatment is performed at 650° C. or more inside, for example, a furnace for high-speed lamp heating after the deposition has been performed. Subsequently, a metal film for use in an upper electrode is formed.

In recent years, portable information terminal units driven by batteries are widely used. In such units, there is a strong demand for reducing the power supply voltage without compromising high-speed operations in order to prolong the battery lifetime. Reducing the threshold voltage is effective in realizing high-speed operations even in low power supply voltages. In this case, however, the leakage current occurring when the gate is off becomes large, so that there should be a lower limit to the threshold voltage. In view of this, instead of the silicon oxide films conventionally used, the use of a high-dielectric-constant film or improvement in structure of the device itself has been proposed.

As a device that can solve this problem and has a small leakage current at a low voltage and high driving force, a device called DTMOS device (Dynamic Threshold Voltage MOSFET) has been proposed, as disclosed in, for example, a literature "A Dynamic Threshold Voltage MOSFET (DTMOS device) for Ultra-Low Voltage Operation", by F. Assaderaghi et. al., IEDM94 Ext. Abst. P.809.

FIG. 21 is a cross-sectional view showing a structure of the known DTMOS device proposed in the literature. As shown in FIG. 21, the known DTMOS is composed of an n-DTMOS device and a p-DTMOS device. Each of the n- and p-DTMOS devices includes: a gate insulating film provided on an active region of a semiconductor substrate; a gate electrode; source/drain regions defined in parts of the active region and located to the right- and left-hand sides of the gate, respectively, (i.e., n-type regions in the n-DTMOS device and p-type regions in the p-DTMOS device); and a substrate region that is the part of the active region except for the source/drain regions (a $p^+$ Si layer in the n-DTMOS device and an $n^+$ Si layer in the p-DTMOS device). Part of the substrate region directly below the gate insulating film is a channel region. The substrate region (a body region) and the gate electrode are connected to be electrically short-circuited via an interconnection. In the structure shown in FIG. 21, an SOI substrate is used, and thus a buried oxide film is formed under the active region.

Application of a bias voltage to the gate with the gate and the body being short-circuited as described above allows a forward bias voltage that is equal to the gate bias voltage to be applied to the channel region via the body. With this application, the same state as in a normal MOS transistor is created when the gate bias is off, and the body is forwardly biased with increase in the gate bias voltage when the gate bias is on, thereby decreasing the threshold voltage.

When the gate bias is off, the leakage current in such a DTMOS device is equal to the leakage current in a normal MOS transistor formed on an SOI substrate (i.e., a transistor in which the gate and the body are not short-circuited). On the other hand, when the gate bias is on, the threshold voltage decreases as described above. Thus, the gate overdrive effect improves, thereby significantly enhancing the driving force. In addition, since there is almost no potential difference between the gate and the channel region in the DTMOS device, a vertical electric field on the surface of the substrate becomes extremely smaller than that in the normal transistor. As a result, deterioration in carrier mobility due to increase in the vertical electric field is suppressed so that the driving force is remarkably enhanced.

Therefore, the DTMOS device functions as a transistor that can operate at high speed with a low threshold voltage, i.e., a low power supply voltage, in part of the operating voltage range before a lateral parasitic bipolar transistor, which occurs among the n-type gate, p-type body (a base) and n-type source/drain regions (an emitter and a corrector), is on and causes the body current to increase to a problematic extent in practice. In addition, the DTMOS device that has substantially the same structure as that of a normal MOS device can be fabricated easily through substantially the same number of fabrication steps as that for the normal MOS device.

PROBLEMS TO BE SOLVED

However, the known dielectric film described above and devices such as DTMOS devices and MIS transistors using the film have the following drawbacks.

In addition, techniques for forming the known high-dielectric-constant or ferroelectric film also have the following shortcomings.

Firstly, because of the heat treatment at 650° C. or more that is required during or after the deposition of the film in order to obtain a film with high crystallinity as described above, materials and fabrication process for the film are considerably constrained. That is to say, it is necessary that the device already formed in and on the substrate before the formation of the film is not adversely affected by the heat treatment at 650° C. or more. Accordingly, it is difficult to form a high-dielectric-constant or ferroelectric film on a semiconductor substrate in which a wire of a metal such as Al or Cu has been formed or to form a high-dielectric-constant or ferroelectric film on a glass substrate.

Secondly, the properties of the underlying layer on which a dielectric film is formed are constrained in characteristics. In a known method, a film having a crystal orientation is formed over a substrate, and then a dielectric film is formed using the film with the crystal orientation as an underlying layer for the dielectric film. The resultant high-dielectric-constant or ferroelectric film exhibits high crystallinity inherited from the orientation of the underlying layer. Therefore, the underlying layer needs to have the orientation. That is to say, in the known method, it is difficult to form a high-dielectric-constant or ferroelectric film on a material having no crystallinity.

In the known DTMOS device, a forward bias is applied between the source and the body as the gate bias voltage increases, so that a so-called body current flows between the source and the body. Thus, in the DTMOS device, it is preferable to suppress the body current and to lower the threshold voltage so as to secure a wide range of the operating voltage. A simple pn junction diode is considered to exist between the source and body regions, and therefore the body current is determined by a semiconductor material (a band gap) and the impurity concentration in the junction portion. In general, the source region is highly doped at a concentration of about $1 \times 10^{20}$ atoms·cm$^{-3}$. If the impurity concentration in the body region increases, the gradient of a build-in potential becomes steeper, thereby aiding a barrier against carrier movement from the body region to the channel region. In this manner, the body current can be suppressed.

However, in the known DTMOS device, the threshold value increases as the impurity concentration in the body region increases. Accordingly, in reality, even if the impurity concentration in the body region is increased, it is difficult to secure a wide range of an operating voltage.

DISCLOSURE OF INVENTION

A first object of the present invention is providing a method for implementing a high-performance semiconductor device by adopting means for improving the characteristics of a dielectric film, especially a high-dielectric-constant or ferroelectric film, without performing heat treatment at high temperature.

A second object of the present invention is providing a novel semiconductor device with a small body current and a wide range of the operating voltage, while enhancing the impurity concentration in the body region of a DTMOS device.

An inventive method is for fabricating a semiconductor device including a dielectric film as an element. The method includes the steps of: a) forming the dielectric film over a substrate; and b) applying an electromagnetic wave in the frequency range from 1 GHz to 100 GHz, both inclusive, from above the dielectric film.

By this method, the application of the EHF wave to the dielectric film improves the characteristics of the dielectric film, e.g., reduces the leakage current in the dielectric film. In addition, the application of the EHF wave can also heat the dielectric film locally. Thus, even if the device is provided on the substrate, it is possible to avoid a negative effect on the device.

In the step b), the electromagnetic wave may be applied while the temperature of the substrate is kept at 550° C. or less. Then, it is possible to avoid a negative effect on the device formed on the substrate with more reliability.

The method may further include the steps of forming, on the dielectric film, a cover film exhibiting a dielectric constant or a dielectric loss greater than that of the dielectric film, after the step a) has been performed and before the step b) is performed; and removing the cover film, after the step b) has been performed. Then, the dielectric film can be heated more effectively by utilizing heating on the cover film by the EHF wave irradiation.

The method may further include the step of forming a lower conductor film, before the step a) is performed.

In the step of forming the lower conductor film, a film made of at least one material selected from the group consisting of metal, $IrO_2$ and $RuO_2$ is preferably formed as the lower conductor film.

The method may further include the step of forming a lower insulating film intervening between the lower conductor film and the dielectric film, after the step of forming the lower conductor film has been performed and before the step a) is performed. Then, the leakage current in the dielectric film can be further reduced.

The method may further include the step of forming an upper conductor film covering the dielectric film, after the step a) has been performed and before the step b) is performed, and the step b) may be performed with the dielectric film covered with the upper conductor film.

The step b) is preferably performed with the upper conductor film electrically grounded.

The method may further include the step of forming an upper conductor film covering the dielectric film and then patterning the upper conductor film so that part of the upper conductor film is left on a region of the dielectric film including at least a portion to be an element of the semiconductor device, after the step a) has been performed and before the step b) is performed. The step b) may be performed such that the region of the dielectric film is locally heated with the part of the upper conductor film left.

In the step of forming the upper conductor film, a film made of at least one material selected from the group consisting of metal, $IrO_2$ and $RuO_2$ is preferably formed as the upper conductor film.

The method may further include the step of forming an upper insulating film intervening between the upper conductor film and the dielectric film, after the step a) has been performed and before the step of forming the upper conductor film is performed. Then, the leakage current in the dielectric film can be reduced.

The method may further include the step of forming a lower seed layer with a thickness of 10 nm or less, before the step a) is performed. In the step a), the dielectric film may be formed to be in contact with the lower seed layer, and in the step b), the lower seed layer may be formed to function as a seed for the growth of the dielectric film. Then, crystal grains in the dielectric film can be grown more smoothly.

The method may further include the step of forming an upper seed layer that has a thickness of 10 nm or less and be in contact with the dielectric film, after the step a) has been performed and before the step b) is performed. In the step b), the upper seed layer may be formed to function as a seed for the growth of the dielectric film. Then, crystal grains in the dielectric film can also be grown more smoothly.

In the step a), a film made of at least one material selected from the group consisting of $PZT(Pb(Zr, Ti)O_3)$, $PLZT((Pb, La)(Zr, Ti)O_3)$, $SBT(SrBi_2Ta_2O_9)$, $(SrBi_2(Nb, Ta)_2O_9)$, $STO(SrTiO_3)$, $BTO(BaTiO_3)$, $BST((Ba, Sr)TiO_3)$ and $BIT(Bi_4Ti_3O_{12})$ is preferably formed as the dielectric film.

The substrate is preferably made of at least one material selected from the group consisting of semiconductor, silicon oxide, glass and ceramic.

In the step b), an electromagnetic wave in the frequency range from 10 GHz to 80 GHz, both inclusive, is preferably applied.

An inventive semiconductor device includes: a substrate; a semiconductor layer provided in part of the substrate; a gate insulating film provided on the semiconductor layer; a gate electrode provided on the gate insulating film; source/drain regions of a first conductivity type defined in the semiconductor layer each to a side of the gate electrode; a channel region for carriers of the first conductivity type defined in the semiconductor layer between the source/drain regions of the first conductivity type; a body region of a second conductivity type that is defined in the semiconductor layer under the channel region for carriers of the first conductivity type and has a potential higher than that in the channel region for carriers of the first conductivity type with respect to carriers in a band edge where carriers flow; and a conductor member for electrically connecting the gate electrode and the body region of the second conductivity type. The channel region for carriers of the first conductivity type is in direct contact with the gate insulating film.

In this device, since the gate electrode is electrically connected to the body region, the potential at the body region is kept substantially equal to that at the gate electrode even when a voltage is applied to the gate electrode. Accordingly, no inversion layer is formed in a region of the semiconductor layer except for the channel region, and formation of a parasitic channel is suppressed. In addition, since the channel region is made of a first semiconductor having a potential smaller than a second semiconductor constituting the body region with respect to carriers in a band edge where carriers flow, a gate bias required for inverting the channel region, i.e., the threshold voltage, can be reduced. Accordingly, the drain current increases, and the difference between the drain current flowing through the channel and the body (gate) current is enlarged, thereby enlarging the operating voltage range.

Further, since no semiconductor layer corresponding to a cap layer is provided between the channel region for carriers of the first conductivity type and the gate insulating film, it is possible to prevent variation in characteristics of the semiconductor device resulting from the variation in thickness of a cap layer. Moreover, formation of a parasitic channel can be prevented. In addition, the threshold voltage can be reduced because the distance from the gate electrode to the channel region for carriers of the first conductivity type can be made small by that distance to which otherwise a cap layer would extend.

The semiconductor device may further include: another semiconductor layer provided in the substrate; another gate insulating film provided on said another semiconductor layer; another gate electrode provided on said another gate insulating film; source/drain regions of the second conductivity type defined in said another semiconductor layer each to a side of said another gate electrode; a channel region for carriers of the second conductivity type defined in said another semiconductor layer between the source/drain regions of the second conductivity type; a body region of the first conductivity type that is defined in said another semiconductor layer under the channel region for carriers of the second conductivity type and has a potential higher than that in the channel region for carriers of the second conductivity type with respect to carriers in a band edge where carriers flow; and another conductor member for electrically connecting said another gate electrode and the body region of the first conductivity type. The semiconductor device may function as a complementary device. Then, in each of a MOS transistor using carriers of the first conductivity type and an n-channel MOS transistor using carriers of the second conductivity type, variation in characteristics of the semiconductor device resulting from the variation in thickness of a cap layer can be prevented.

Each of the channel region for carriers of the first conductivity type and the channel region for carriers of the second conductivity type may be made of a semiconductor containing silicon (Si), germanium (Ge) and carbon (C) as components; and the body regions may be made of Si. Then, since the channel region in each of the semiconductor layers is made of an identical SiGeC film, the structure and the process can be simplified.

The semiconductor device may further include a channel region for carriers of the second conductivity type provided between the channel region for carriers of the first conductivity type and the body region of the second conductivity type. The semiconductor device may further include: another semiconductor layer provided in the substrate; another gate insulating film provided on said another semiconductor layer; another gate electrode provided on said another gate insulating film; source/drain regions of the second conductivity type defined in said another semiconductor layer each to a side of said another gate electrode; a channel region for carriers of the second conductivity type defined in said another semiconductor layer between the source/drain regions of the second conductivity type; a channel region for carriers of the first conductivity type defined in said another semiconductor layer between said another gate insulating film and the channel region for carriers of the second conductivity type; a body region of the first conductivity type that is defined in said another semiconductor layer under the channel region for carriers of the second conductivity type and has a potential higher than that in the channel region for carriers of the second conductivity type, with respect to carriers in a band edge where carriers flow; and another conductor member for electrically connecting said another gate electrode and the body region of the first conductivity type. The semiconductor device may function as a complementary device.

In this device, a surface channel is formed in the channel region for carriers of the first conductivity type, while a buried channel is formed in the channel region for carriers of the first conductivity type. In particular, the surface channel is formed immediately under the gate insulating film, thus reducing the threshold voltage of a MOS transistor using carriers of the first conductivity type.

In that case, the body region in each of the semiconductor layers may be made of Si; the channel region of the first conductivity type in each of the semiconductor layers may be made of $Si_{1-y}C_y$ ($0<y\leq0.03$); the channel region of the first conductivity type in the semiconductor layer may function as an n-channel where electrons flow; the channel region of the second conductivity type in each of the semiconductor layers is made of $Si_{1-x}Ge_x$ ($0<x\leq0.4$); and the channel region of the second conductivity type in said another semiconductor layer may function as a p-channel where holes flow.

Alternatively, the body region in each of the semiconductor layers may be made of Si; the channel region of the first conductivity type in each of the semiconductor layers may be made of $Si_{1-x}Ge_x$ ($0<x\leq0.4$); the channel region of the first conductivity type in the semiconductor layer may function as a p-channel where holes flow; the channel region of the second conductivity type in each of the semiconductor layers may be made of $Si_{1-y}C_y$ ($0<y\leq0.03$); and the channel region of the second conductivity type in said another semiconductor layer may function as an n-channel where electrons flow.

The gate insulating film may be made of at least one material selected from the group consisting of SiON, $Si_3N_4$, $ZrO_2$, $HfO_2$, $Ta_2O_5$, PZT(Pb(Zr, Ti)$O_3$), PLZT((Pb, La)(Zr, Ti)$O_3$), SBT ($SrBi_2Ta_2O_9$), ($SrBi_2$(Nb, Ta)$_2O_9$), STO ($SrTiO_3$), BTO($BaTiO_3$), BST((Ba, Sr)$TiO_3$) and BIT ($Bi_4Ti_3O_{12}$). Then, the use of a material having a dielectric constant higher than that of $SiO_2$ that is generally used ensures high driving force and reduction in the threshold voltage. That is to say, the use of the high-dielectric-constant material makes the curve of the built-in potential steeper. Thus, the threshold voltage can be reduced and the difference between the drain current and the body current is further enlarged. Accordingly, even if the impurity concentration in the body region is increased, it is possible to set the threshold voltage to a value substantially equal to that of a MOS transistor made of only Si. As a result, the body resistance is reduced and the potential at the body region is effectively transmitted to the channel region so that the operating speed is less limited by a CR delay.

It is preferable that the gate insulating film has been subjected to irradiation with an electromagnetic wave in the frequency range from 1 GHz to 100 GHz, both inclusive.

The semiconductor substrate may be an SOI substrate. Then, operating speed improves due to the decrease in a parasitic capacitance.

BRIEF DESCRIPTION OF DRAWINGS

FIGS. 16(a) and 16(b) are energy band diagrams showing built-in potentials at the SiGe/SiC/Si heterojunction portions in the n- and p-HDTMOS devices, respectively.

BEST MODE FOR CARRYING OUT THE INVENTION

Embodiment 1

FIGS. 1(a) through 2(b) are cross-sectional views showing respective process steps for fabricating a semiconductor device according to a first embodiment of the present invention.

Figure 1A:
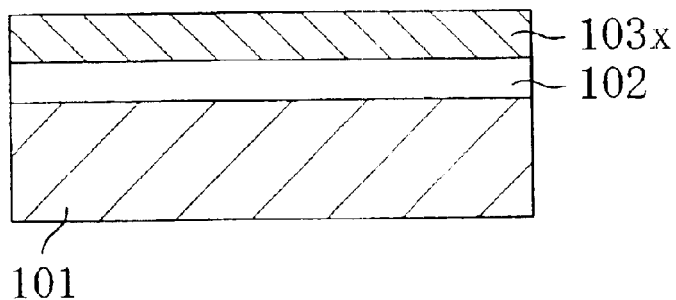
FIGS. 1(a) through 1(c) are cross-sectional views showing the first half of the process steps for fabricating a semiconductor device according to a first embodiment of the present invention.

First, in a process step shown in FIG. 1(a), by thermal oxidation, for example, a silicon oxide film 102 with a thickness of 100 nm is formed on a p-type Si substrate 101, and then a Pt film 103x is deposited to a thickness of 200 nm over the silicon oxide film 102.

Figure 1B:
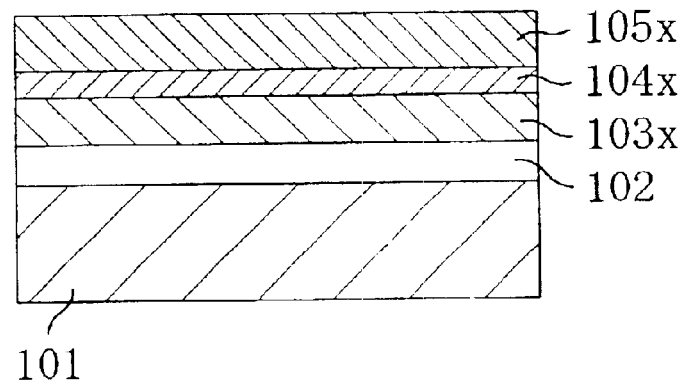

Next, in a process step shown in FIG. 1(b), with a sputtering process, a Ti film 104x is deposited to a thickness of 6 nm over the Pt film 103x, and then a ferroelectric PZT (Pb(Zr, Ti)$O_3$) film 105x is deposited to a thickness of 500 nm at a substrate temperature of 600° C. In this case, the Pt film 103x serves as a lower electrode and the Ti film 104x serves as a seed layer for growing the PZT film 104x.

Figure 1C:
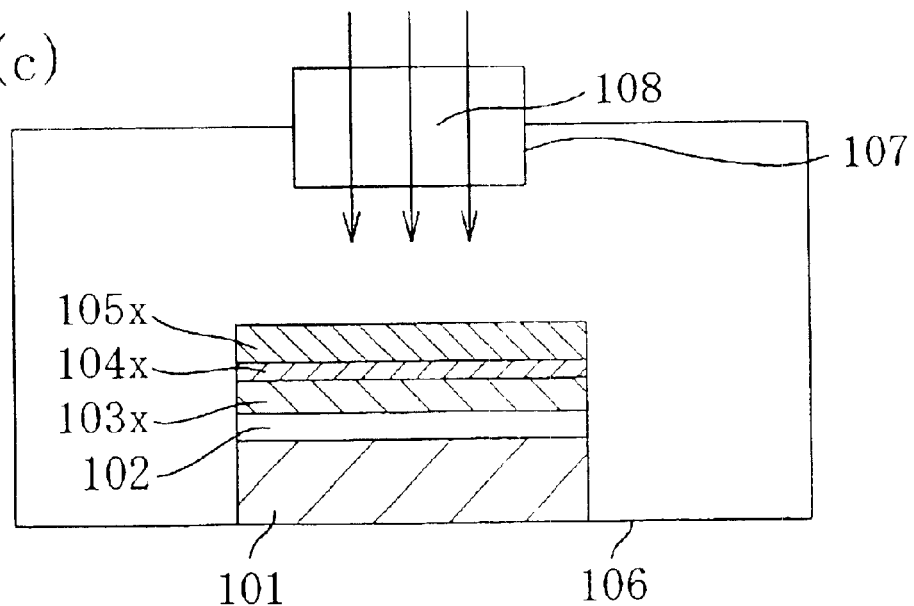

Then, in a process step shown in FIG. 1(c), the Si substrate 101 is placed inside a chamber 106, and an electromagnetic wave in the frequency range from 10 GHz to 80 GHz, both inclusive, (e.g., 28 GHz) (hereinafter, simply referred to as an "extremely high frequency (EHF) wave 108"), is introduced into the chamber 106 through an EHF-wave introducing port 107 so that the PZT film 105x is irradiated therewith. While the temperature of the Si substrate 101 is monitored with, for example, a thermocouple, the output from the EHF wave 108 is controlled such that the substrate temperature is kept at 350° C. or less. Under these circumstances, the EHF wave 108 is applied for about 30 to 90 minutes, both inclusive, (e.g., 60 minutes). During the application, the atmosphere in the chamber 106 may be generally air. However, there are cases where irradiation with the EHF wave in an atmosphere of nitrogen or oxygen is more suitable for improving the characteristics of the dielectric film, depending on the type of the dielectric, the film thickness, the material used for the underlying film, or the like.

In this embodiment, the dielectric film is irradiated with the electromagnetic wave in the frequency range from 10 GHz to 80 GHz, both inclusive (i.e., the EHF wave). However, in the process steps of this embodiment, the effect of the present invention can also be attained by applying an electromagnetic wave in the frequency range from 1 GHz to 100 GHz, both inclusive. However, the application of the electromagnetic wave in the frequency range from 10 GHz to 80 GHz, both inclusive, (i.e., the EHF wave) to the dielectric film especially ensures the effect of the present invention. The EHF-wave processing generally requires a chamber having a size about 100 times larger than the frequency. However, the application of an electromagnetic wave in the frequency of 10 GHz is advantageous because an EHF-wave irradiation can be applied uniformly using a chamber that is one-tenth in size of a chamber for use in application of an electromagnetic wave in the frequency of 1 GHz. In addition, the higher the frequency of an irradiated electromagnetic wave is, the more energy the dielectric film absorbs from the electromagnetic wave, and therefore the dielectric film can be heated more effectively.

Figure 2A:
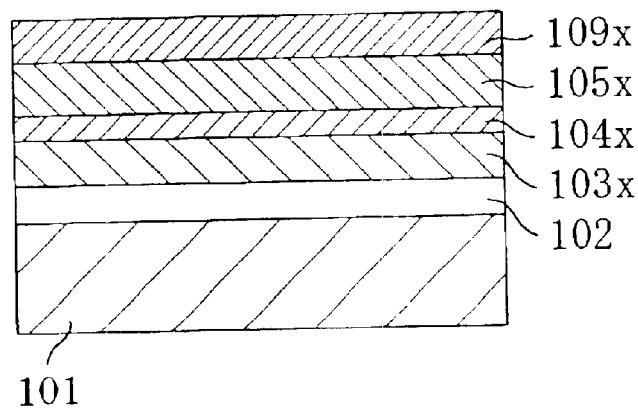
FIGS. 2(a) and 2(b) are cross-sectional views showing the latter half of the process steps for fabricating a semiconductor device according to the first embodiment.

Then, in a process step shown in FIG. 2(a), an $IrO_2$ film 109x is deposited to a thickness of 500 nm over the PZT film 105x with a sputtering process, for example.

Figure 2B:
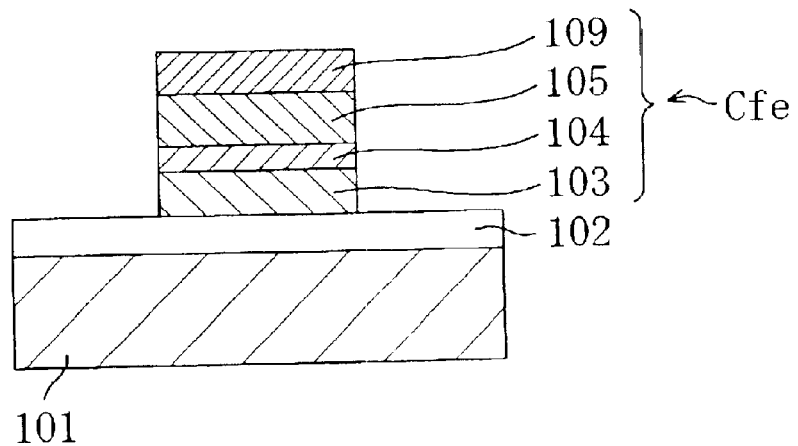

Thereafter, in a process step shown in FIG. 2(b), ordinary photolithography and dry-etching are performed, thereby patterning the $IrO_2$ film 109x, PZT film 105x, Ti film 104x, and Pt film 103x in this order, to form a ferroelectric capacitor Cfe made up of lower electrode 103, seed layer 104, capacitive film 105, and upper electrode 109.

The ferroelectric capacitor Cfe thus formed exhibited excellent properties, i.e., a strong remanent polarization and a small leakage current. For example, with respect to a Pt electrode having a diameter of 0.1 mm, the leakage current was $9.07 \times 10^{-10}$ A with no EHF wave applied, while the leakage current was $5.05 \times 10^{-10}$ A with the EHF wave applied. That is to say, the leakage current is reduced almost one-half due to the application of the EHF wave.

It was also found that the crystallinity of the ferroelectric film changes due to the application of the EHF wave. This experiment was conducted using a sample in which a silicon oxide film and a BIT ($Bi_4Ti_3O_{12}$) film were stacked on a Si substrate. In the experiment, the BIT film was deposited by a sputtering process using a BIT target and the substrate was not heated. An X-ray diffraction showed that the BIT film has an amorphous structure in an as-grown state. Then, a sample in which the BIT film had been heated at 600° C. for five minutes by applying the EHF wave thereto in the atmosphere and a sample in which the entire sample provided with the BIT film had been heated at 600° C. for five minutes in the atmosphere using a furnace for high-speed lamp heating were prepared.

Figure 3A:
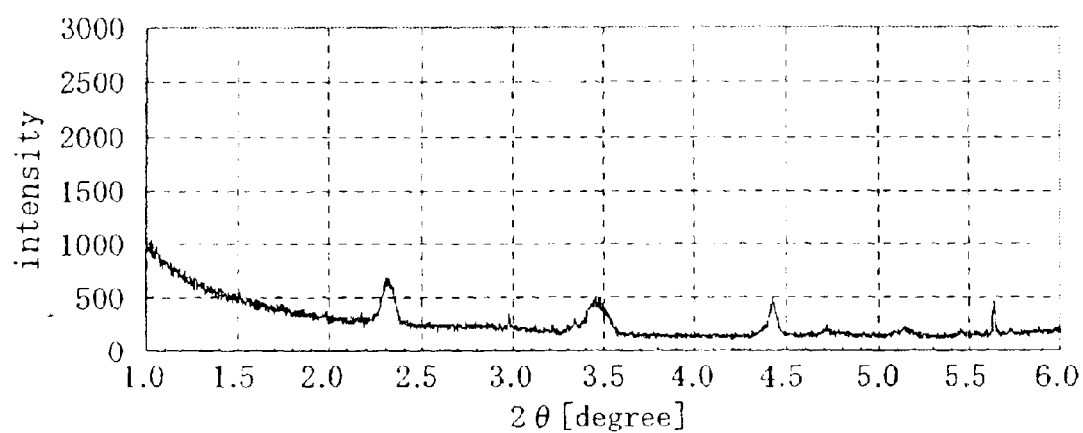
FIGS. 3(a) and 3(b) are respectively an X-ray diffraction photograph of a BIT film heated by irradiation with an EHF wave and an X-ray diffraction photograph of a BIT film heated with a furnace for high-speed lamp heating.
Figure 3B:
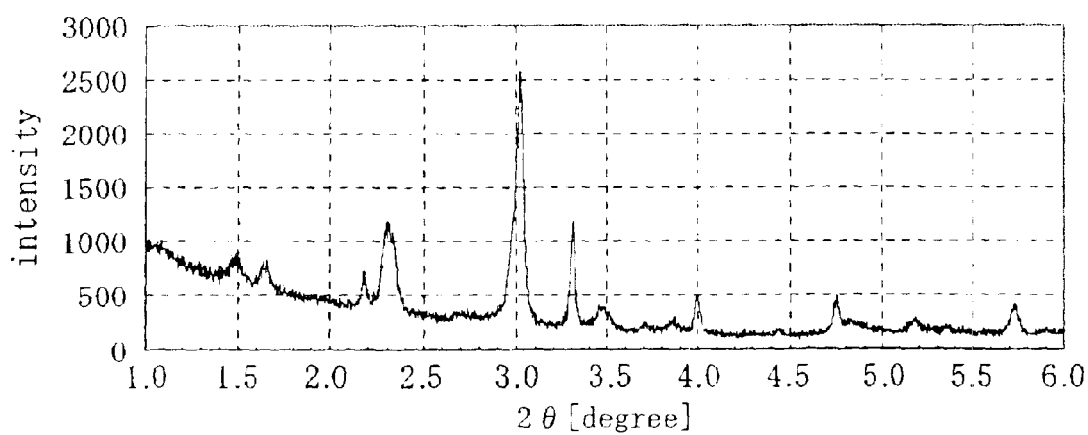

FIGS. 3(a) and 3(b) are respectively an X-ray diffraction photograph of a BIT film heated by irradiation with the EHF wave and an X-ray diffraction photograph of a BIT film heated with the furnace for high-speed lamp heating. As shown in FIG. 3(a), the width between peaks of the X-ray diffraction intensity for the sample heated by the EHF wave irradiation is large, while the width between peaks of the X-ray diffraction intensity for the sample heated with the high-speed lamp-heating furnace is small.

That is to say, FIGS. 3(a) and 3(b) shows that the grain size in the BIT film, i.e., a ferroelectric film, heated by the EHF wave irradiation is larger than that heated with the high-speed lamp-heating furnace.

In addition, it was found that crystal orientation and crystalline phase differ between the dielectric film subjected to the EHF wave irradiation and the dielectric film subjected to heating with the high-speed lamp-heating furnace. That is to say, crystal growth, which cannot occur through normal crystallization by uniform heating from outside, was shown to have occurred in the dielectric film irradiated with the EHF wave.

Figure 4A:
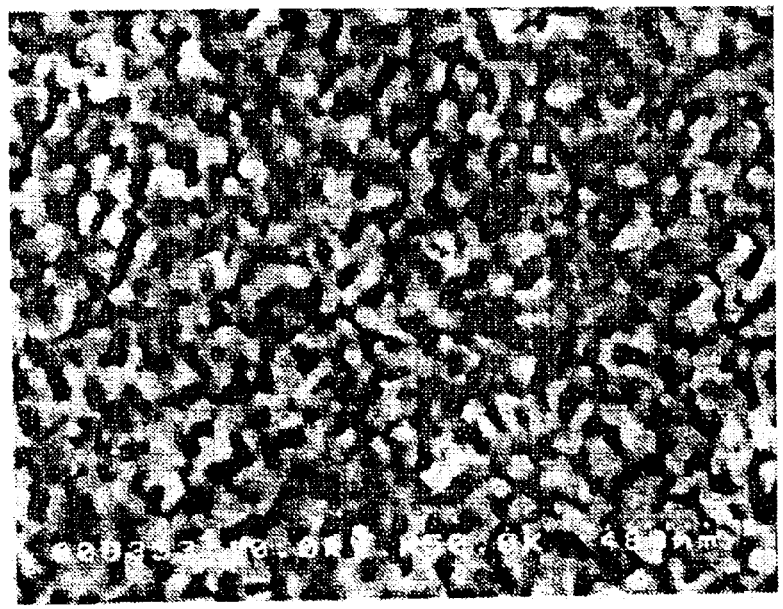
FIGS. 4(a) and 4(b) are respectively an SEM photograph of the BIT film heated by the EHF wave irradiation and an SEM photograph of the BIT film heated with the high-speed lamp-heating furnace.
Figure 4B:
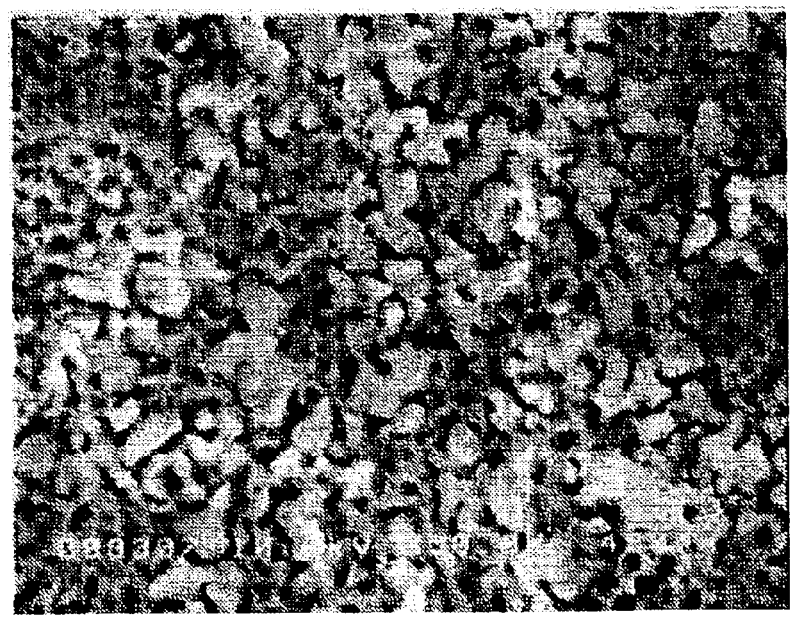

FIGS. 4(a) and 4(b) are respectively an SEM photograph showing the surface of the BIT film heated by the EHF wave irradiation and an SEM photograph showing the surface of the BIT film heated with the high-speed lamp-heating furnace. As shown in FIG. 4(a), the grain size for the sample heated by the EHF wave irradiation is relatively small, while as shown in FIG. 4(b), the grain size for the sample heated with the high-speed lamp-heating furnace is relatively large. The surface unevenness of the dielectric film heated by the EHF wave irradiation is smaller than that heated with the high-speed lamp-heating furnace.

The dielectric film with small grain size, i.e., miniaturized crystal grains, is obtained by the EHF wave irradiation, as described above, because of the following reasons.

In general, with the EBF wave irradiation, the dielectric causes absorption as expressed by the following equation:

$$P = 2\pi f \cdot \epsilon_0 \cdot \epsilon_r \cdot \tan \delta \cdot E^2$$

where P is an absorption coefficient of the EHF wave, f is a frequency of the EHF wave, $\epsilon_0$ is a dielectric constant, $\epsilon_r$ is a relative dielectric constant, tan δ is a dielectric loss, and E is an electric-field intensity.

Therefore, the dielectric generates self-heating by absorbing the EBF wave. In this case, the absorption is large especially in the portion where the dielectric loss is large such as a grain boundary. In particular, during the EHF wave irradiation, only the dielectric film is effectively heated, while the substrate under the dielectric film is not substantially heated. This indicates that the EHF wave is effectively absorbed in the grain boundary in the dielectric film. From the fact that the substrate and the ambient atmosphere are hardly heated, it is estimated that a temperature difference between the dielectric film and the ambient atmosphere becomes large, resulting in miniaturizing crystal grains in the dielectric film. The fact also shows that the dielectric film is selectively overheated by the EHF wave irradiation, facilitating arrangement of the polarization axis in the direction of the EHF wave frequency.

In particular, materials that are easily revaporized from the substrate, e.g., Pb- or Bi-based materials such as PZT, are considered to be effective especially in suppressing crystal grains on the substrate as well as in preventing revaporization of the dielectric film from the substrate under the condition that the temperature of the ambient atmosphere of the dielectric film is low as in the EHF wave irradiation.

The miniaturization of crystal grains in the dielectric film indicates that the leakage current has been reduced. This is considered the same as the phenomenon that the resistance increases as the crystal grains in the polysilicon film become smaller. In addition, enhancement of the orientation in the dielectric film increases the relative dielectric constant.

Furthermore, miniaturization of crystal grains in the dielectric film suppresses the variation in capacitance of the capacitor. Thus, heating the dielectric film with the EHF wave irradiation as in this embodiment improves reliability of the device including the dielectric film, combined with the decrease in the leakage current.

Moreover, if a dielectric film (particularly a ferroelectric or high-dielectric-constant film) used as an element of a semiconductor device is subjected to an EHF wave irradiation as in this embodiment, it is possible to attain the following remarkable effects.

In heating the dielectric film on the semiconductor substrate, temperature difference between the dielectric film and the ambient atmosphere becomes wider during the EHF wave irradiation because Si, SiGe, GaAs and other materials have thermal conductivities like metals. As a result, it is concluded that the crystal grains in the dielectric film can be further miniaturized. In addition, since only the dielectric film can be selectively heated, it is possible to attain a great effect that the profile of a doped layer (e.g., source/drain regions in an MIS transistor) defined in a semiconductor substrate is not adversely affected.

In a semiconductor device, the gate structure and the memory capacitor in the memory cell need to be downsized, and thus the reliability is more effectively improved due to the miniaturization of crystal grains in the dielectric film. Moreover, by obtaining the dielectric film with a small leakage current, the gate insulating film and the capacitive film of the memory capacitor can be made thin. This enables a large capacity of the dielectric film in a small area, thereby attaining the advantages of lowing the voltage at which an MIS transistor operates and of downsizing a ferroelectric memory or a memory cell of a DRAM.

Therefore, it is possible to form a semiconductor device including a very small transistor with a design rule at the level of 0.1 $\mu$m and a display device with a memory function composed of a thin film transistor (TFT) formed on a glass substrate and a ferroelectric film, for example.

In this embodiment, the p-type Si substrate is used as a substrate. Alternatively, an n-type Si substrate may be used, or a substrate made of another semiconductor such as GaAs or a substrate made of an insulator such as quartz or ceramic may be used. Then, it is possible to use a glass substrate that is weak against heat at 500° C. or more.

In this embodiment, a Pr film is used for the lower electrode 103 provided under the capacitive film 105 of PZT. Alternatively, another metal such as Cu or Ag may be used, or a material such as Pt, $IrO_2$ or $RuO_2$ that is generally used for an electrode for use in a ferroelectric capacitor may be used.

In this embodiment, a PZT film 105x (a dielectric film) is deposited after the deposition of the Pt film 103x to be a lower electrode and the Ti film 104x as a seed layer for the dielectric film. Alternatively, a lower electrode may be formed by patterning the Pt film 103x before the dielectric film is deposited. In that case, the electrode may be formed by ordinary photo-etching and damascene processes.

In this embodiment, a Ti film is used for the seed layer 104. Alternatively, a film of PLT, $ZrO_2$ or like materials may be used. The seed layer is not necessarily provided or may be provided on either the top of the bottom of the dielectric film.

In this embodiment, $IrO_2$ is used as a material for the upper electrode 109 in order to prevent reduction of the PZT film. Alternatively, other materials such as Pt and $RuO_2$ may be used so long as the materials hardly cause the reduction or under conditions where the reduction is hardly caused.

In this embodiment, PZT is used as a material for the capacitive film 105. Alternatively, as a material for the capacitive film 105, a ferroelectric material such as PLZT ((Pb, La)(Zr, Ti)$O_3$) in which La is added to PZT (Pb(Zr, Ti)$O_3$), SBT (SrBi$_2$Ta$_2$O$_9$), (SrBi$_2$(Nb, Ta)$_2$O$_9$), STO (SrTiO$_3$), BTO (BaTiO$_3$) or BIT (Bi$_4$Ti$_3$O$_{12}$) or a high-dielectric-constant material such as BST ((Ba, Sr)TiO$_3$) may be used.

In this embodiment, the PZT film 105 is irradiated with the EHF wave 108 immediately after the PZT film 105x has been deposited. However, there are cases where the EHF wave is preferably applied after a conductor film for the upper electrode has been formed, depending on the type, thickness and structure of the dielectric film.

FIG. 2(b) pertaining to this embodiment shows the structure in which only the silicon oxide film 102 and the Si substrate 101 are provided under the ferroelectric capacitor Cfe. However, in a normal MOS or bipolar process, regions such as source/drain, collector, base and emitter regions for a transistor have been formed.

Embodiment 2

FIGS. 5(a) through 6(b) are cross-sectional views showing respective process steps for fabricating a semiconductor device according to a second embodiment of the present invention.

Figure 5A:
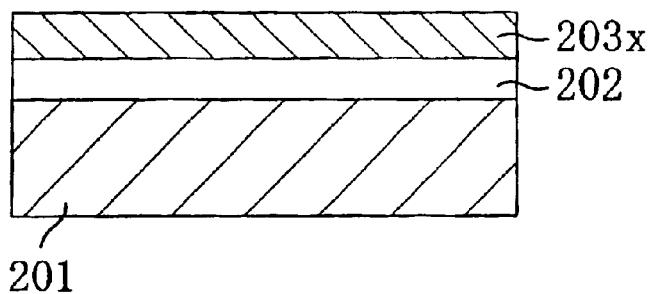
FIGS. 5(a) through 5(c) are cross-sectional views showing the first half of the process steps for fabricating a semiconductor device according to a second embodiment of the present invention.

First, in a process step shown in FIG. 5(a), by thermal oxidation, for example, a silicon oxide film 202 with a thickness of 300 nm is formed on a p-type Si substrate 201, and then an Al film 203x is deposited to a thickness of 800 nm over the silicon oxide film 202.

Figure 5B:
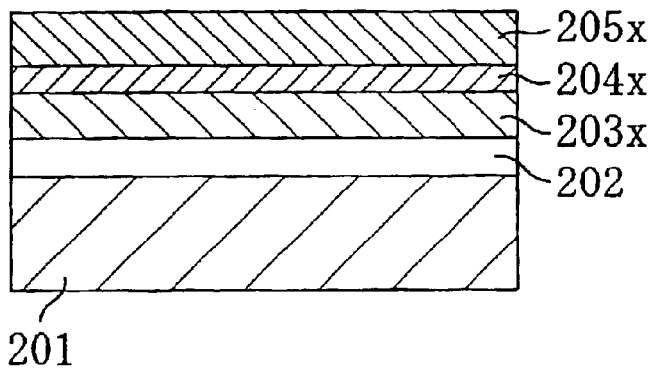

Next, in a process step shown in FIG. 5(b), with a sputtering or CVD process, a SiO$_2$ film 204x is deposited to a thickness of 10 nm over the Al film 203x, and then a ferroelectric PZT (Pb(Zr, Ti)O$_3$) film 205x is deposited to a thickness of 300 nm at a substrate temperature of 600° C. During these process steps, the Si substrate 201 is kept at 400° C. or less.

Figure 5C:
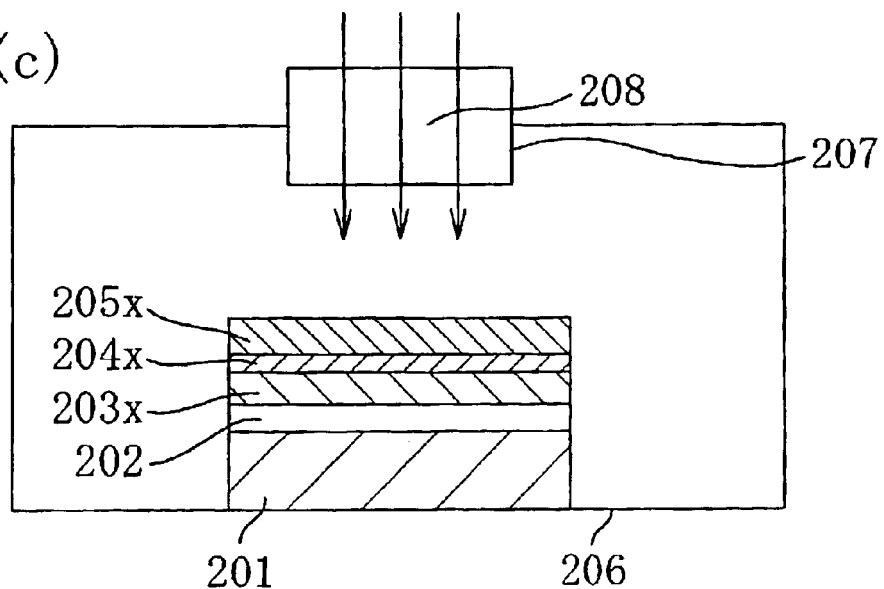

Then, in a process step shown in FIG. 5(c), the Si substrate 201 is placed inside a chamber 206, and an electromagnetic wave in the frequency range from 10 GHz to 80 GHz, both inclusive, (e.g., 28 GHz) (hereinafter, simply referred to as an "extremely high frequency (EHF) wave 208"), is introduced into the chamber 206 through an EHF-wave introducing port 207 so that the Si substrate 201 is irradiated therewith. While the temperature of the Si substrate 201 is monitored with, for example, a thermocouple, the output from the EHF wave 208 is controlled such that the substrate temperature is kept at 350° C. or less. Under these circumstances, the EHF wave 208 is applied for about 30 to 90 minutes, both inclusive, (e.g., 60 minutes). During the application, the atmosphere in the chamber 206 may be generally air. However, there are cases where irradiation with the EHF wave in an atmosphere of nitrogen or oxygen is more suitable for improving the characteristics of the dielectric film, depending on the type of the dielectric, the film thickness, the material used for the underlying film, or the like.

In this embodiment, the dielectric film is irradiated with the electromagnetic wave in the frequency range from 10 GHz to 80 GHz, both inclusive, (i.e., the EHF wave). However, in the process steps of this embodiment, the effect of the present invention can also be attained by applying an electromagnetic wave in the frequency range from 1 GHz to 100 GHz, both inclusive. However, the application of the electromagnetic wave in the frequency range from 10 GHz to 80 GHz, both inclusive, (i.e., the EHF wave) to the dielectric film especially ensures the effect of the present invention.

Figure 6A:
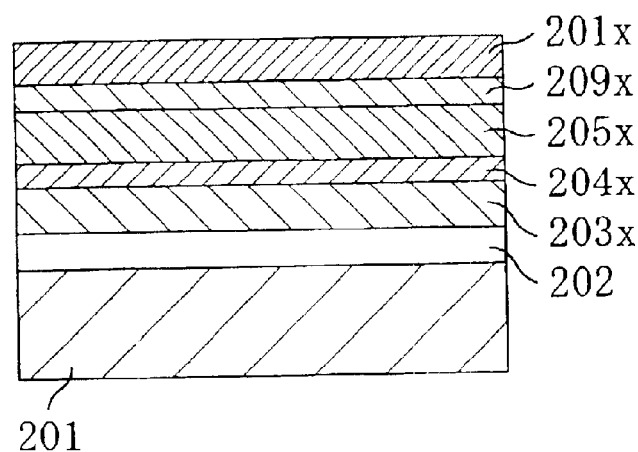
FIGS. 6(a) and 6(b) are cross-sectional views showing the latter half of the process steps for fabricating a semiconductor device according to the second embodiment.

Then, in a process step shown in FIG. 6(a), a SiO$_2$ film 209x is deposited to a thickness of 10 nm over the PZT film 205x with a sputtering or CVD process. Subsequently, an IrO$_2$ film 210x is deposited to a thickness of 500 nm over the SiO$_2$ film 209x with a sputtering process, for example.

Figure 6B:
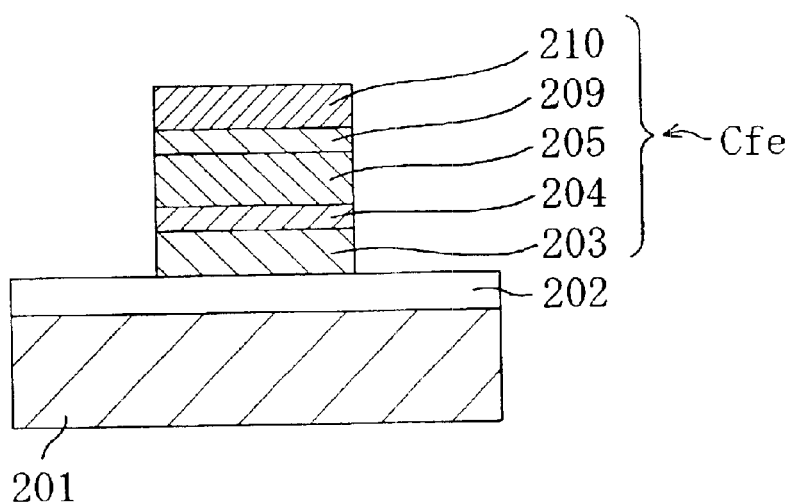

Thereafter, in a process step shown in FIG. 6(b), ordinary photolithography and dry-etching processes are performed, thereby patterning the IrO$_2$ film 210x, SiO$_2$ film 209x, PZT film 205x, SiO$_2$ film 204x, and Al film 203x, to form a ferroelectric capacitor Cfe made up of lower electrode 203, lower insulating film 204, capacitive film 205, upper insulating film 209, and upper electrode 210.

In this embodiment, the lower insulating film 204 of SiO$_2$ is provided between the capacitive film 205 of PZT and the lower electrode 203. The upper insulating film 209 is provided between the capacitive film 205 and the upper electrode 210. By thus sandwiching the capacitive film 205 of PZT between the lower and upper insulating films 204 and 209 with high insulation performance, it is possible to further suppress the leakage current in the entire ferroelectric capacitor Cfe, and the characteristics of the ferroelectric capacitor Cfe can be further improved, as compared to the first embodiment.

In particular, in the known method, no high-quality ferroelectric film is formed on an amorphous SiO$_2$ film even if the substrate temperature is high. However, according to this embodiment, in a process during or after the formation of a ferroelectric film such as a PZT film, irradiation with the EHF wave 208 eliminates the necessity of keeping the substrate at 500° C. or more even when the dielectric film is heated to high temperatures. Thus, a high-quality ferroelectric film is formed without adversely affecting device characteristics of, for example, a transistor provided on the substrate.

In addition, it is possible to form a semiconductor device including a very small transistor with a design rule at the level of 0.1 μm and a display device with a memory function composed of a thin film transistor (TFT) formed on a glass substrate and a ferroelectric film, for example.

In this embodiment, a SiO$_2$ film is used as an insulating film. Instead of the SiO$_2$ films 204x and 209x, a Si$_3$N$_4$ or SiON film generally used as a gate insulating film for an MIS transistor, a Si$_3$N$_4$ film, a SiON film, a CeO$_2$ film, a Pr$_2$O$_3$ film, a ZrO$_2$ film, an Al$_2$O$_3$ film, an AlN film, for example, or a multi-layered film as a stack of these insulating films may be used.

In this embodiment, the p-type Si substrate is used as a substrate. Alternatively, an n-type Si substrate may be used, or a substrate made of another semiconductor such as GaAs or a substrate made of an insulator such as quartz or ceramic may be used. Then, it is possible to use a glass substrate that is weak against heat at 500° C. or more.

In this embodiment, a Pt film is used for the lower electrode 203 provided under the capacitive film 205 of PZT. Alternatively, other metals such as Cu and Ag may be used, or materials such as Pt, IrO$_2$ and RuO$_2$ that are generally used for an electrode for use in a ferroelectric capacitor may be used.

In this embodiment, the PZT film 205x (a dielectric film) is deposited after the Pt film 203x to be a lower electrode and the SiO$_2$ film 204x as an insulating film have been deposited. Alternatively, a lower electrode may be previously formed by patterning the Pt film 203x before the deposition of the dielectric film. In that case, the lower electrode may be formed by ordinary photo-etching and damascene processes.

In this embodiment, IrO$_2$ is used as a material for the upper electrode 210 in order to prevent reduction of the PZT film. Alternatively, other materials such as Pt and RuO$_2$ may be used so long as the materials hardly cause the reduction or under conditions where the reduction is hardly caused.

In this embodiment, PZT is used as a material for the capacitive film 205. Alternatively, as a material for the capacitive film 205, a ferroelectric material such as PLZT ((Pb, La)(Zr, Ti)O$_3$) in which La is added to PZT (Pb(Zr, Ti)O$_3$), SBT (SrBi$_2$Ta$_2$O$_9$), (SrBi$_2$(Nb, Ta)$_2$O$_9$), STO (SrTiO$_3$), BTO (BaTiO$_3$) or BIT (Bi$_4$Ti$_3$O$_{12}$) or a high-dielectric-constant material such as BST ((Ba, Sr)TiO$_3$) may be used.

In this embodiment, the PZT film 205 is irradiated with the EHF wave 208 immediately after the PZT film 205x has been deposited. However, there are cases where the EHF wave is preferably applied after a conductor film for use in the upper electrode has been formed, depending on the type, thickness and structure of the dielectric film.

FIG. 6(b) of this embodiment shows the structure in which only the silicon oxide film 202 and the Si substrate 201 are provided under the ferroelectric capacitor Cfe. However, in an ordinary MOS or bipolar process, regions such as source/drain, collector, base and emitter regions for a transistor have been formed.

Embodiment 3

FIGS. 7(a) through 8(b) are cross-sectional views showing respective process steps for fabricating a semiconductor device according to a third embodiment of the present invention.

Figure 7A:
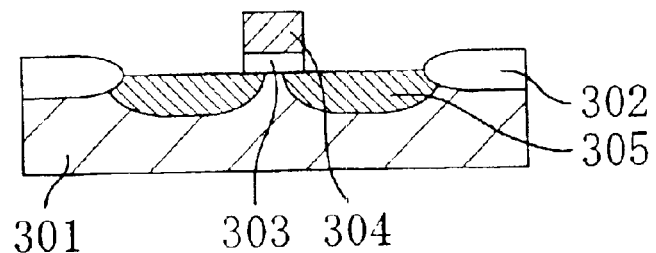
FIGS. 7(a) through 7(c) are cross-sectional views showing the first half of the process steps for fabricating a semiconductor device according to a third embodiment of the present invention.

First, in a process step shown in FIG. 7(a), local oxidation of silicon, for example, is performed so that an isolation oxide film 302 with a thickness of about 400 nm having a so-called LOCOS structure is formed on part of a Si substrate 301. Then, to control the threshold voltage of the transistor, p-type dopant ions such as boron are implanted into the Si substrate 301. A channel stopper region doped with the p-type impurity such as boron is defined in part of the Si substrate 301 that is in contact with the isolation oxide film 302. In some cases, a p-well may be defined. Thereafter, the surface of the p-type Si substrate 301 is oxidized by thermal oxidation, thereby forming a gate oxide film 303 to be a gate insulating film having a thickness of about 10 nm on an active region surrounded by the isolation oxide film 302. In this embodiment, the case of forming an n-channel MOS transistor is described. However, in a CMOS device, a p-channel MOS transistor is also formed. For forming the p-channel MOS transistor, ion implantations are performed, i.e., an impurity for controlling the threshold voltage (e.g., phosphorus, arsenic or boron, selected depending on a material for a gate electrode), an n-type impurity for forming a channel stopper, and an n-type impurity for forming an n-well are respectively implanted into the Si substrate 301. Subsequently, a polysilicon film is deposited to a thickness of about 330 nm over the substrate with a process such as a low-pressure CVD process. The polysilicon film is highly doped with phosphorus at a concentration of about $10^{20}$ cm$^{-3}$ by a solid phase diffusion method using POCl$_3$, for example, to form a degenerate heavily-doped n-type polysilicon. Then, after a photoresist mask (not shown) has been formed using photolithography, for example, the heavily-doped n-type polysilicon film is patterned by dry-etching such as RIE using the photoresist mask, thereby forming a polysilicon gate electrode 304. Thereafter, arsenic or phosphorus ions are implanted using the polysilicon gate electrode 304 and the isolation oxide film 302 as a mask. Then, the impurity is activated by, for example, RTA, thereby forming an n-type doped layer 305 to be source/drain regions.

Figure 7B:
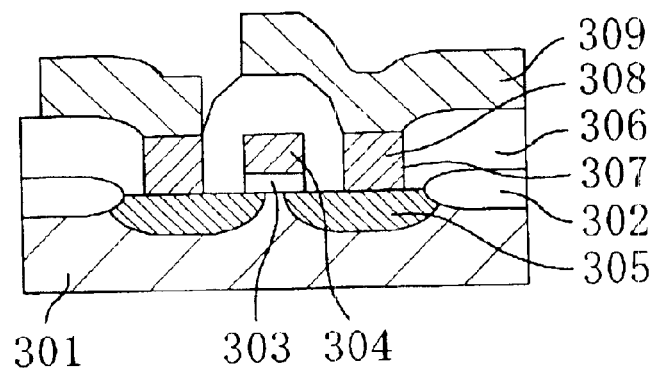

Next, in a process step shown in FIG. 7(b), an interlevel dielectric film 306 made of a silicon oxide film is deposited to a thickness of about 800 nm over the substrate, and then ordinary photolithography and dry-etching processes are performed, thereby forming a contact hole 307 reaching the n-type doped layer 304 through the interlevel dielectric film 306. Although FIG. 7(b) shows only the contact hole 307 on the n-type doped layer 305 to be source/drain regions, another contact hole is formed to reach the polysilicon gate electrode 304 though the interlevel dielectric film 306 in another cross-section other than the cross-section shown in FIG. 7(b). Then, the contact hole 307 is filled with tungsten by, for example, a CVD process, thereby forming a tungsten plug 308. Subsequently, after an aluminum alloy film (containing Cu and Si in many cases) has been deposited to a thickness of about 800 nm over the tungsten plug 308 and the interlevel dielectric film 306, the aluminum alloy film is patterned using ordinary photolithography and dry-etching, thereby forming an aluminum interconnect 309.

Figure 7C:
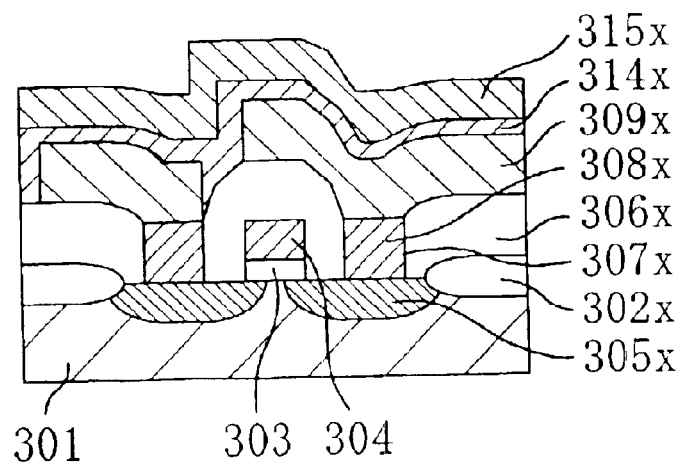

Then, in a process step shown in FIG. 7(c), a $SiO_2$ film 314x is deposited to a thickness of 10 nm over the aluminum interconnect 309 with a sputtering or plasma CVD process. Subsequently, a ferroelectric PZT (Pb(Zr, Ti)$O_3$) film 315x is deposited to a thickness of 300 nm with the same sputtering process or an MO-CVD process. During these process steps, the temperature of the Si substrate 301 is kept at 400° C. or less.

Figure 8A:
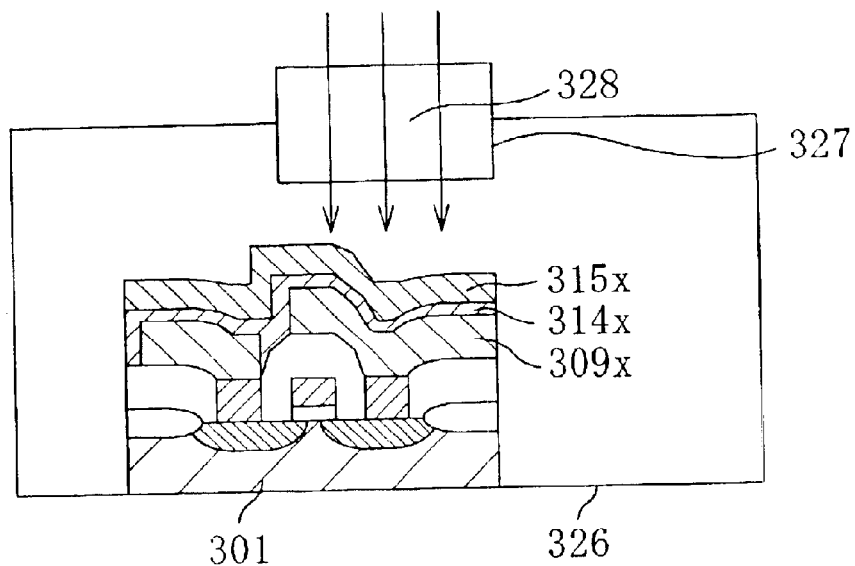
FIGS. 8(a) and 8(b) are cross-sectional views showing the latter half of the process steps for fabricating a semiconductor device according to the third embodiment.

Thereafter, in a process step shown in FIG. 8(a), the Si substrate 301 is placed inside a chamber 326, and an EHF wave 328 in the frequency range from 10 GHz to 80 GHz, both inclusive, (e.g., 28 GHz), is introduced into the chamber 326 through an EHF-wave introducing port 327 so that the PZT film 315x is irradiated therewith. While the temperature of the Si substrate 301 is monitored with, for example, a thermocouple, the output from the EHF wave 328 is controlled such that the substrate temperature is kept at 350° C. or less. Under these circumstances, the EHF wave 328 is applied for about 30 to 90 minutes, both inclusive, (e.g., 60 minutes). During the application, the atmosphere in the chamber 326 may be generally air. However, there are cases where irradiation with the EHF wave in an atmosphere of nitrogen or oxygen is more suitable for improving the characteristics of the dielectric film, depending on the type of the dielectric, the film thickness, the material used for the underlying film, or the like.

In this embodiment, the dielectric film is irradiated with the electromagnetic wave in the frequency range from 10 GHz to 80 GHz, both inclusive, (i.e., the EHF wave). However, in the process steps of this embodiment, the effect of the present invention can also be attained by applying an electromagnetic wave in the frequency range from 1 GHz to 100 GHz, both inclusive. However, the application of the electromagnetic wave in the frequency range from 10 GHZ to 80 GHz, both inclusive, (i.e., the EHF wave) to the dielectric film especially ensures the effect of the present invention.

Figure 8B:
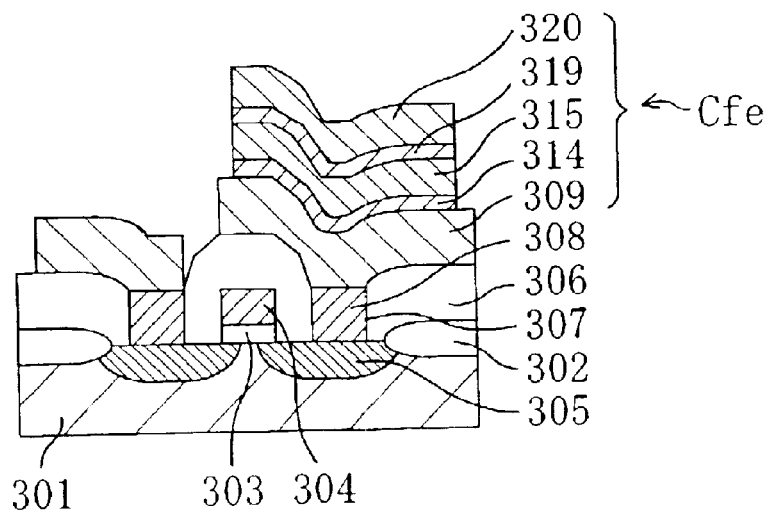

Next, in a process step shown in FIG. 8(b), a $SiO_2$ film with a thickness of 10 nm is formed on the PZT film 315x with a process such as a sputtering or plasma CVD process. Subsequently, after an $IrO_2$ film has been deposited to a thickness of 500 nm over $SiO_2$ film with a sputtering process, for example, ordinary photolithography and dry-etching processes are performed, thereby patterning the $IrO_2$ film, PZT film 315x and $SiO_2$ film 314x, to form a ferroelectric capacitor Cfe that is provided with lower insulating film 314, capacitive film 305, upper insulating film 319, and upper electrode 320 and includes the aluminum interconnect 309 as a lower electrode.

Thereafter, a passivation film made up of a plasma oxide film with a thickness of about 200 nm and a plasma nitride film with a thickness of about 600 nm (not shown) is formed, and then a bonding pad (not shown) is formed therein.

The ferroelectric capacitor Cfe thus formed exhibited excellent properties, i.e., a strong remanent polarization and a small leakage current. It is estimated that this is because the PZT film 315 was selectively heated by the EHF wave irradiation so that the crystallinity has improved due to miniaturization of crystal grains in the PZT film and arrangement of the polarization axis in the direction of vibration of the EHF wave.

In this embodiment, the MOS transistor is formed under the principal surface of the resultant ferroelectric capacitor. Alternatively, a bipolar transistor may be formed using a bipolar process. According to this embodiment, the substrate is not necessarily kept at high temperatures of 500° C. or more during and after the formation of the ferroelectric film, so that characteristics of the transistor previously formed on the substrate do not deteriorate. In addition, a ferroelectric capacitor can be formed directly over the transistor, thereby reducing the substrate area and attaining higher integration. Therefore, it is possible to form a semiconductor device including a very small transistor with a design rule at the level of 0.1 μm and to form a display device with a memory function composed of a thin film transistor (TFT) formed on a glass substrate and a ferroelectric film, for example. The present invention is also applicable to a neuron device including a ferroelectric as the memory element.

In this embodiment, the lower insulating film 314 of $SiO_2$ is provided between the aluminum interconnect 309 and the capacitive film 315. The upper insulating film 319 of $SiO_2$ is provided between the capacitive film 315 and the upper electrode 320 of $IrO_2$. By thus sandwiching the capacitive film 315 between the $SiO_2$ films with high insulation performance, it is possible to further suppress the leakage current in the entire ferroelectric capacitor Cfe, and the characteristics of the ferroelectric capacitor Cfe can be further improved, as compared to the first embodiment.

In particular, in the known method, no high-quality ferroelectric film is formed on an amorphous $SiO_2$ film even if the substrate temperature is high. However, according to this embodiment, in a process after the formation of a ferroelectric film such as a PZT film, irradiation with the EHF wave 308 eliminates the necessity of keeping the substrate at 500° C. or more even when the dielectric film is heated to high temperatures. Thus, a high-quality ferroelectric film is formed without adversely affecting device characteristics of, for example, a transistor provided on the substrate.

In this embodiment, $SiO_2$ films are used as the upper and lower insulating films 319 and 314. Instead of the $SiO_2$ films, a $Si_3N_4$ or SiON film generally used as a gate insulating film for an MIS transistor, a $CeO_2$ film, a $Pr_2O_3$ film, a $ZrO_2$ film, an $Al_2O_3$ film, an AlN film, for example, or a multi-layered film as a stack of these insulating films may be used.

In this embodiment, the p-type Si substrate 301 is used as a substrate. Alternatively, an n-type Si substrate may be used, or a substrate made of another semiconductor such as GaAs or a substrate made of an insulator such as quartz or ceramic may be used. Then, it is possible to use a glass substrate that is weak against heat at 500° C. or more.

In this embodiment, the aluminum interconnect 309 is used as the lower electrode for the capacitive film 315. Alternatively, other metals such as Cu and Ag may be used, or materials such as Pt, $IrO_2$ and $RuO_2$ that are generally used for an electrode for use in a ferroelectric capacitor may be used.

In this embodiment, ordinary photolithography and etching processes are used for forming the aluminum interconnect 309 by patterning. Alternatively, a damascene process may be used.

In this embodiment, no seed layer is formed as a seed for forming a ferroelectric film. Alternatively, a film such as a Ti, PLT, or $ZrO_2$ film may be provided between the aluminum interconnect 309 and the capacitive film 315 or between the capacitive film 315 and the upper electrode 320 to make contact with the capacitive film 315 so as to be used as a seed layer.

In this embodiment, $IrO_2$ is used as a material for the upper electrode 320 in order to prevent reduction of the PZT film. Alternatively, other materials such as Pt and $RuO_2$ may be used so long as the materials hardly cause the reduction or under conditions where the reduction is hardly caused.

In this embodiment, PZT is used as a material for the capacitive film 305. Alternatively, as a material for the capacitive film 305, a ferroelectric material such as PLZT ((Pb, La)(Zr, Ti)$O_3$) in which La is added to PZT (Pb(Zr, Ti)$O_3$), SBT (SrBi$_2$Ta$_2$O$_9$), (SrBi$_2$(Nb, Ta)$_2$O$_9$), STO (SrTiO$_3$), BTO (BaTiO$_3$) or BIT (Bi$_4$Ti$_3$O$_{12}$) or a high-dielectric-constant material such as BST ((Ba, Sr)TiO$_3$) may be used.

Embodiment 4

FIGS. 9(a) through 10(b) are cross-sectional views showing respective process steps for fabricating a semiconductor device according to a fourth embodiment of the present invention.

Figure 9A:
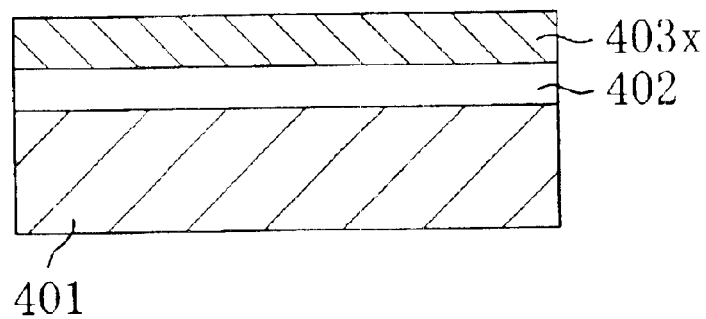
FIGS. 9(a) through 9(c) are cross-sectional views showing the first half of the process steps for fabricating a semiconductor device according to a fourth embodiment of the present invention.

First, in a process step shown in FIG. 9(a), by thermal oxidation, for example, a silicon oxide film 402 with a thickness of 300 nm is formed on a p-type Si substrate 401, and then an Al film 403x is deposited to a thickness of 800 nm over the silicon oxide film 402.

Figure 9B:
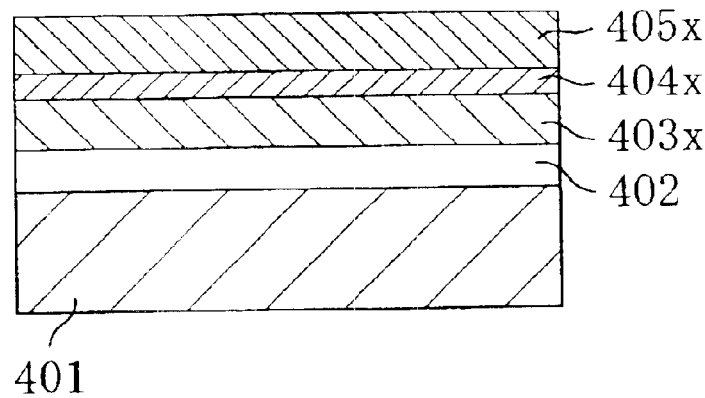

Next, in a process step shown in FIG. 9(b), with a sputtering process, a Ti film 404x is deposited to a thickness of 10 nm over the Al film 403x, and then a ferroelectric PZT (Pb(Zr, Ti)$O_3$) film 405x is deposited to a thickness of 300 nm. In this case, the Al film 403x serves as a lower electrode and the Ti film 404x serves as a seed layer for growing the PZT film 404x. During these process steps, the substrate temperature is kept at 400° C. or less.

Figure 9C:
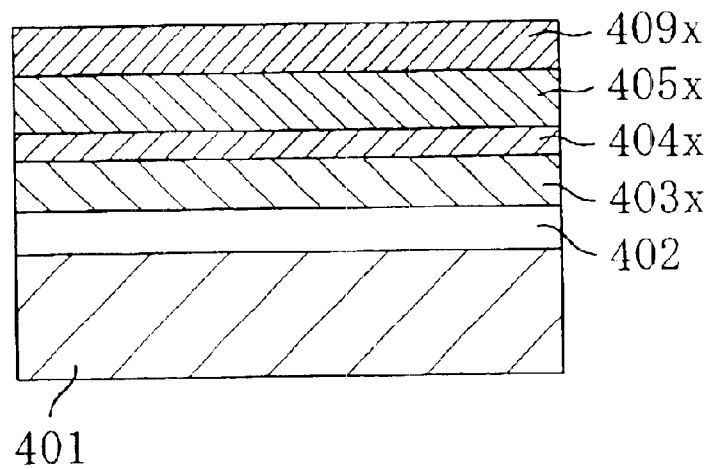

Then, in a process step shown in FIG. 9(c), an Ir film 409x is deposited to a thickness of 500 nm over the PZT film 405x with a sputtering process, for example.

Figure 10A:
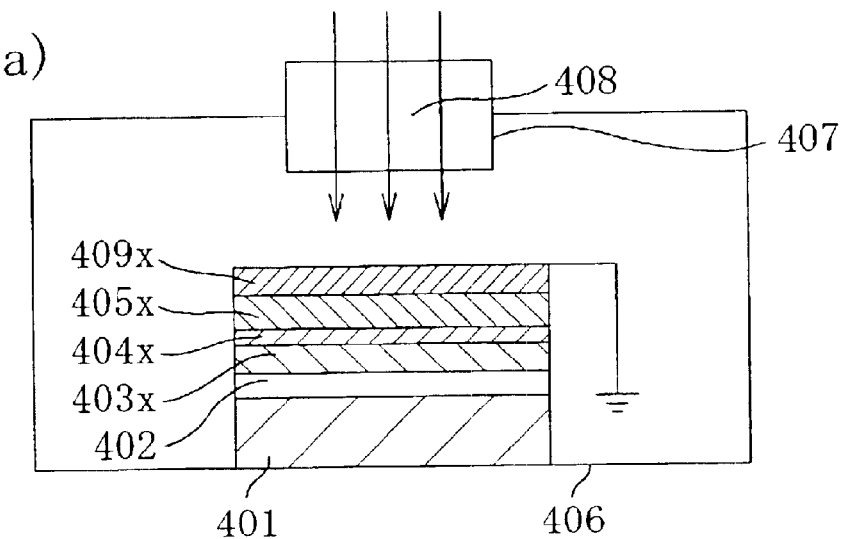
FIGS. 10(a) and 10(b) are cross-sectional views showing the latter half of the process steps for fabricating a semiconductor device according to the fourth embodiment.

Then, in a process step shown in FIG. 10(a), the Si substrate 401 is placed inside a chamber 406, and an EHF wave 408 in the frequency range from 10 GHz to 80 GHz, both inclusive, (e.g., 28 GHz) is introduced into the chamber 406 through an EHF-wave introducing port 407 so that the Ir and PZT films 409x and 405x are irradiated therewith. During the irradiation with the EHF wave 408, the Ir film 409x is connected to a ground. While the temperature of the Si substrate 401 is monitored with, for example, a thermocouple, the output from the EHF wave 408 is controlled such that the substrate temperature is kept at 350° C. or less. Under these circumstances, the EHF wave 408 is applied for about 30 to 90 minutes, both inclusive, (e.g., 60 minutes). During the application, the atmosphere in the chamber 406 may be generally air. However, there are cases where irradiation with the EHF wave in an atmosphere of nitrogen or oxygen is more suitable for improving the characteristics of the dielectric film, depending on the type of the dielectric, the film thickness, the material used for the underlying film, or the like.

In this embodiment, the dielectric film is irradiated with the electromagnetic wave in the frequency range from 10 GHz to 80 GHz, both inclusive, (i.e., the EHF wave). However, in the process steps of this embodiment, the effect of the present invention can also be attained by applying an electromagnetic wave in the frequency range from 1 GHz to 100 GHz, both inclusive. However, the application of the electromagnetic wave in the frequency range from 10 GHz to 80 GHz, both inclusive, (i.e., the EHF wave) to the dielectric film especially ensures the effect of the present invention.

Figure 10B:
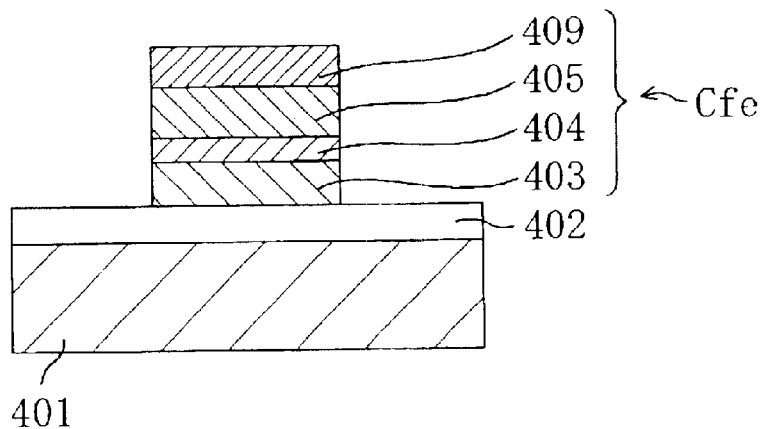

Thereafter, in a process step shown in FIG. 10(b), ordinary photolithography and dry-etching are performed, thereby patterning the $IrO_2$ film 409x, PZT film 405x, Ti film 404x, and Al film 403x, to form a ferroelectric capacitor Cfe made up of lower electrode 403, seed layer 404, capacitive film 405, and upper electrode 409.

In this embodiment, the EHF wave 408 is applied with the PZT film 405x covered with the Ir film 409x in the process step shown in FIG. 10(a). Since the Ir film 409x is connected to a ground, it is possible to avoid closed-loop flow of a current induced by the EHF wave 408 in the Ir film 409x that causes overheating, and damage to a device formed on the substrate due to induction hating can be prevented. Accordingly, in this embodiment, the PZT film 405x can also be locally heated, thereby attaining the same effect as in the first embodiment. That is to say, improvement in characteristics such as reduction in leakage current by, for example, miniaturization of crystal grains in the dielectric film can be attained.

The process step shown in FIG. 10(a) may be performed after the upper electrode 409, for example, has been formed by patterning the Ir film 409x, for example. Though this case is advantageous because only part of the PZT film 405x that is actually used can be effectively heated, it is difficult to connect the upper electrode 409 having a fine pattern to a ground. Thus, special consideration is required for preventing discharge current from flowing through the PZT film.

In this embodiment, Ir is used as a material for the upper electrode 409 in order to prevent reduction of the PZT film. Alternatively, other materials such as Pt and $RuO_2$ may be used so long as the materials hardly cause the reduction or under conditions where the reduction is hardly caused.

In this embodiment, PZT is used as a material for the capacitive film 405. Alternatively, as a material for the capacitive film 405, a ferroelectric material such as PLZT ((Pb, La)(Zr, Ti)$O_3$) in which La is added to PZT (Pb(Zr, Ti)$O_3$), SBT (SrBi$_2$Ta$_2$O$_9$), (SrBi$_2$(Nb, Ta)$_2$O$_9$), STO (SrTiO$_3$), BTO (BaTiO$_3$) or BIT (Bi$_4$Ti$_3$O$_{12}$) or a high-dielectric material such as BST ((Ba, Sr)TiO$_3$) may be used.

FIG. 10(b) of this embodiment shows the structure in which only the silicon oxide film 402 and the Si substrate 401 are provided under the ferroelectric capacitor Cfe. However, in an ordinary MOS or bipolar process, regions such as source/drain, collector, base and emitter regions for a transistor have been formed.

Embodiment 5

FIGS. 11(a) through 12(b) are cross-sectional views showing respective process steps for fabricating a semiconductor device according to a fifth embodiment of the present invention.

Figure 11A:
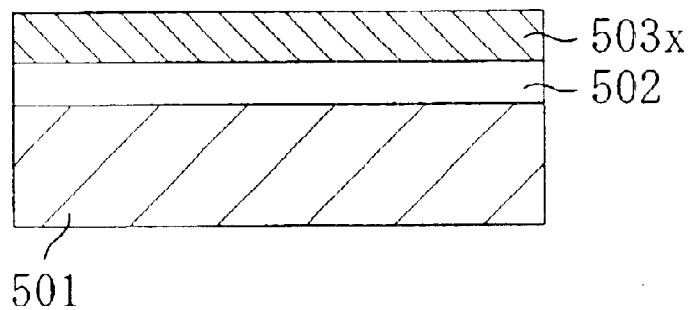
FIGS. 11(a) through 11(c) are cross-sectional views showing the first half of the process steps for fabricating a semiconductor device according to a fifth embodiment of the present invention.

First, in a process step shown in FIG. 11(a), by thermal oxidation, for example, a silicon oxide film 502 with a thickness of 300 nm is formed on a p-type Si substrate 501, and then an Ir film 503x is deposited to a thickness of 800 nm over the silicon oxide film 502.

Figure 11B:
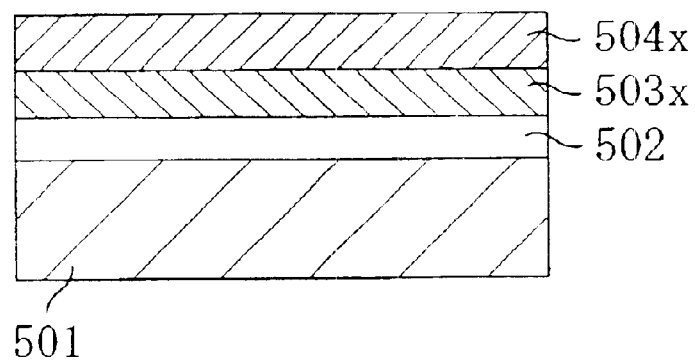

Next, in a process step shown in FIG. 11(b), with a sputtering process, a ferroelectric BIT ($Bi_4Ti_3O_{12}$) film 504x, which is a ferroelectric film, is deposited to a thickness of 300 nm.

Figure 11C:
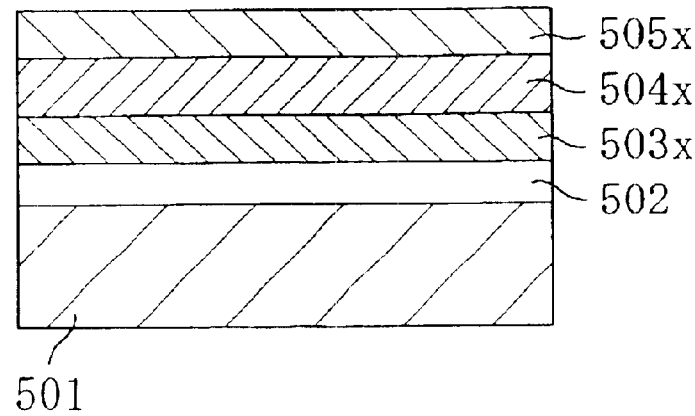

Then, in a process step shown in FIG. 11(c), a cover film 505x made of a film exhibiting high dielectric loss (e.g., BST ($Ba_xSr_{1-x}TiO_3$)) is deposited over the BIT film 504x with a sputtering process, for example.

Figure 12A:
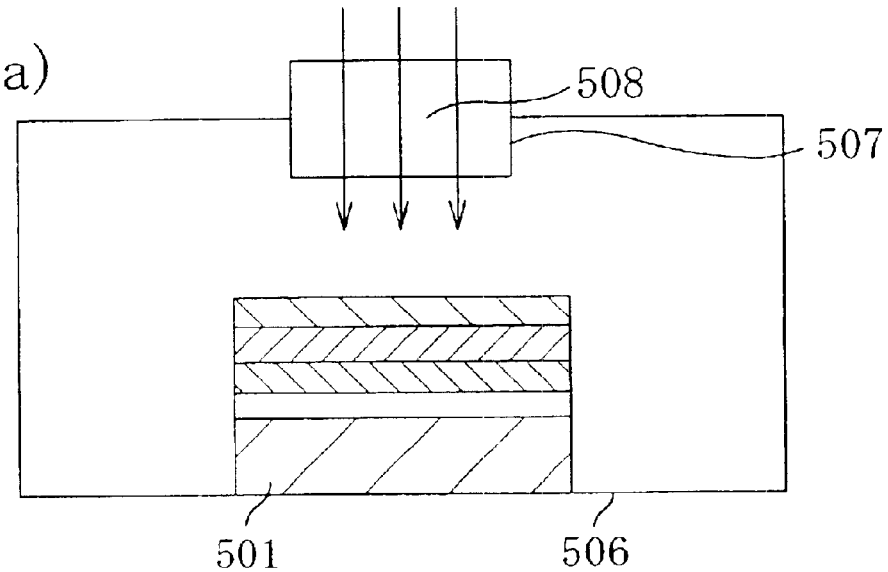
FIGS. 12(a) and 12(b) are cross-sectional views showing the latter half of the process steps for fabricating a semiconductor device according to the fifth embodiment.

Thereafter, in a process step shown in FIG. 12(a), the Si substrate 501 is placed inside a chamber 506, and an EHF wave 508 in the frequency range from 10 GHz to 80 GHz, both inclusive, (e.g., 28 GHz) is introduced into the chamber 506 through an EHF-wave introducing port 507 so that the cover film 505x and the BIT film 504x are irradiated therewith. During the irradiation with the EHF wave 508, the cover film 505x is not necessarily connected to a ground. While the temperature of the Si substrate 501 is monitored with, for example, a thermocouple, the output from the EHF wave 508 is controlled such that the substrate temperature is kept at 350° C. or less. Under these circumstances, the EHF wave 508 is applied for about 30 to 90 minutes, both inclusive, (e.g., 60 minutes). During the application, the atmosphere in the chamber 506 may be generally air. However, there are cases where irradiation with the EHF wave in an atmosphere of nitrogen or oxygen is more suitable for improving the characteristics of the dielectric film, depending on the type of the dielectric, the film thickness, the material used for the underlying film, or the like.

In this embodiment, the dielectric film is irradiated with the electromagnetic wave in the frequency range from 10 GHz to 80 GHz, both inclusive, (i.e., the EHF wave). However, in the process steps of this embodiment, the effect of the present invention can also be attained by applying an electromagnetic wave in the frequency range from 1 GHz to 100 GHz, both inclusive. However, the application of the electromagnetic wave in the frequency range from 10 GHz to 80 GHz, both inclusive, (i.e., the EHF wave) to the dielectric film especially ensures the effect of the present invention.

Figure 12B:
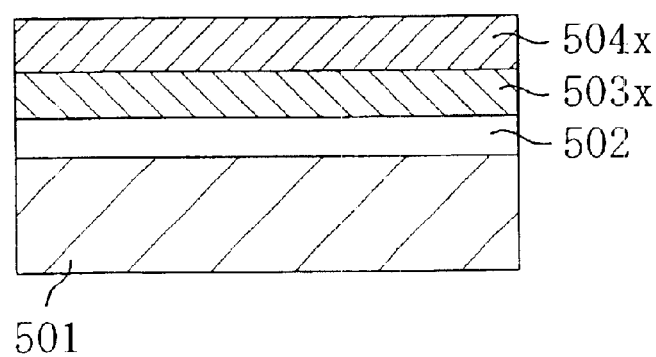

Thereafter, in a process step shown in FIG. 12(b), the cover film 505x is removed. Though subsequent process steps are not shown, a conductor film (e.g., a Pt or $IrO_2$ film) for an upper electrode is deposited over the BIT film 504x, and then ordinary photolithography and dry-etching are performed, thereby patterning the conductor film, the BIT film 504x and the Ir film 503x, to form a ferroelectric capacitor including lower electrode, capacitive film and upper electrode.

In this embodiment, since the EHF wave 508 is applied with the BIT film 504x covered with the cover film 505x exhibiting high dielectric loss in the process step shown in FIG. 12(a), the cover film 504x absorbs the EHF wave effectively and is heated. Therefore, through the use of this heating effect of the cover film 505x on the dielectric film, improvement in characteristics such as reduction in leakage current by, for example, miniaturization of crystal grains in the dielectric film can be attained more effectively.

The cover film 505x used in this embodiment is preferably made of a material having a dielectric constant or dielectric loss greater than that of the dielectric film subjected to the process with the EHF wave 508, e.g., the BIT film 504x in this embodiment. In general, the dielectric loss of dielectric materials tends to increase as the temperature rises. However, some of these materials, e.g., ferroelectric materials, exhibit a maximum dielectric loss near the Curie temperature, and therefore the material for the cover film 505x is preferably selected depending on the dielectric property of the dielectric film to be subjected to the EHF-wave processing. In this embodiment, BIT is adopted as a material for the capacitive film. The Curie temperature of BLT is around 600° C. and the relative dielectric constant of the paraelectric component is relatively small, i.e., from 50 to 100. Therefore, in this embodiment, the cover film 505x of a high-dielectric-constant film such as a BST film is formed on the BIT film 504x.

The BST film is easily removed using a dry-etching process that is generally used, e.g., reactive ion etching.

In this embodiment, as a material for the upper electrode, other materials such as Pt and $RuO_2$ may be used as well as Ir and $IrO_2$.

In this embodiment, BIT is used as a material for the capacitive film 504. Alternatively, as a material for the capacitive film 504, a ferroelectric material such as PLZT ((Pb, La)(Zr, Ti)$O_3$) in which La is added to PZT (Pb(Zr, Ti)$O_3$), SBT ($SrBi_2Ta_2O_9$), ($SrBi_2Nb$, Ta)$_2O_9$), STO ($SrTiO_3$), BTO ($BaTiO_3$) or BIT ($Bi_4Ti_3O_{12}$) or a high-dielectric-constant material such as BST ((Ba, Sr)$TiO_3$) may be used.

FIG. 12(b) of this embodiment shows the structure in which only the silicon oxide film 502 and the Si substrate 501 are provided under the region where the ferroelectric capacitor is to be formed. However, in an ordinary MOS or bipolar process, regions such as source/drain, collector, base and emitter regions for a transistor have been formed.

Embodiment 6

Next, a sixth embodiment, which is an example of a complementary heterojunction dynamic threshold voltage MOSFET (HDTMOS device) with a SiC/SiGe/Si heterojunction, will be described. In this embodiment, a channel region for an n-channel is made of a SiC/SiGe heterojunction portion, and a channel region for a p-channel is made of a SiGe/Si heterojunction portion. For the sake of convenience, the term "DTMOS device" is also used herein even in a case where a gate insulating film is an insulating film other than a silicon oxide film, e.g., a silicon nitride, silicon oxinitride, or high-dielectric-constant film. Therefore, a MIS transistor in the inventive DTMOS device may be provided with a gate insulating film made of, for example, a nitride or oxinitride film.

Figure 13:
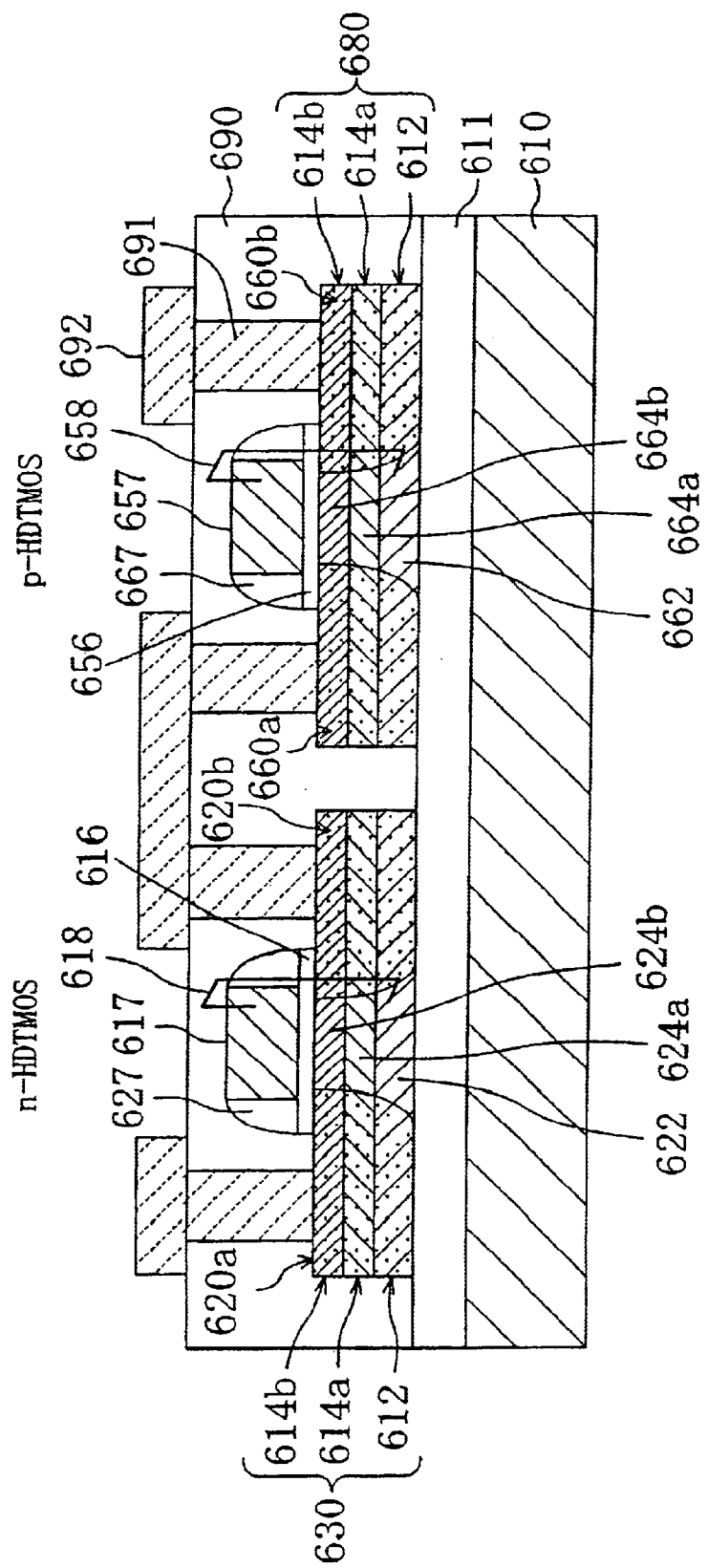
FIG. 13 is a cross-sectional view showing a structure of a complementary HDTMOS device according to a sixth embodiment of the present invention.

FIG. 13 is a cross-sectional view showing a structure of a complementary HDTMOS device (hereinafter, referred to as a c-HDTMOS device) according to a sixth embodiment of the present invention. As shown in FIG. 13, the c-HDTMOS device of this embodiment includes: a p-type substrate 610; a buried oxide film 611 defined by a process, e.g., implanting oxygen ions into the Si substrate; a semiconductor layer 630 for an n-channel HDTMOS device (an n-HDTMOS device) provided on the buried oxide film 611; and a semiconductor layer 680 for a p-channel HDTMOS device (a p-HDTMOS device) provided on the buried oxide film 611. The semiconductor layers 630 and 680 are made of an identical film, i.e., are formed at the same time.

Each of the semiconductor layers 630 and 680 includes: an upper Si film 612 constituting the upper portion of the SOI substrate; a SiGe ($Si_{1-x}Ge_x$: x=0.40) film 614a epitaxially grown on the upper Si film 612 by an UHV-CVD process; and a SiC ($Si_{1-y}C_y$: y≈0.020) film 614b epitaxially grown on the SiGe film 614a by an UHV-CVD process. In this case, the thicknesses of the buried oxide film 611, upper Si film 612, SiGe film 614a and SiC film 614b are about 100 nm, about 100 nm, about 10 nm and about 10 nm, respectively.

The n-HDTMOS device further includes: a gate insulating film 616 made of a silicon oxide film on a SiC film 614b; and a gate electrode 617 of polysilicon formed on the gate insulating film 616 and containing an n-type impurity (e.g., P, As) at a high concentration. In parts of the semiconductor layer 630 that are located to both sides of the gate electrode 617, source/drain regions 620a and 620b containing an n-type impurity at a high concentration are provided. Part of the upper Si film 612 located between the source/drain regions 620a and 620b is a Si body region 622 containing a p-type impurity at a high concentration (about $1 \times 10^{19}$ atoms·cm$^{-3}$). Parts of the SiGe film 614a and the SiC film 614b located between the source/drain regions 620a and 620b are a SiGe p-channel region 624a and a SiC n-channel region 624b, respectively, which are undoped layers containing a p-type impurity at a relatively low concentration. A contact 618 as a conductor member for electrically connecting the gate electrode 617 and the Si body region 622 is provided. A sidewall 627 of a silicon oxide film is provided on the sides of the gate electrode 617.

The p-HDTMOS device further includes: a gate insulating film 656 made of a silicon oxide film on a SiC film 614b, and a gate electrode 657 formed on the gate insulating film 656 and containing a p-type impurity (e.g., B) at a high concentration. In parts of the semiconductor layer 680 that are located to both sides of the gate electrode 657, source/drain regions 660a and 660b containing a p-type impurity at a high concentration are provided. Part of the upper Si film 612 located between the source/drain regions 660a and 660b is a Si body region 662 containing an n-type impurity at a high concentration (about $1 \times 10^{19}$ atoms·cm$^{-3}$). Parts of the SiGe film 614a and the SiC film 614b located between the source/drain regions 660a and 660b are a SiC n-channel region 624a and a SiGe p-channel region 624b, respectively, which are undoped layers containing an n-type impurity at a relatively low concentration. A contact 658 as a conductor member for electrically connecting the gate electrode 657 and the Si body region 662 is provided. A sidewall 667 of a silicon oxide film is provided on the sides of the gate electrode 657.

Over the substrate, an interlevel dielectric film 690, contacts 691 that are respectively in contact with the source/drain regions 620a, 620b, 660a and 660b through the interlevel dielectric film 690, and source/drain electrodes 692 connected to the contacts 691 and extending on the interlevel dielectric film 690 are provided.

In a process for fabricating the complementary HDTMOS device of this embodiment, the upper Si film, which is part of the SOI substrate, includes a p$^+$ Si layer (an n-HDTMOS device region) and an n$^+$ Si layer (a p-HDTMOS device region), doped with an impurity at a concentration of about $1 \times 10^{19}$ atoms·cm$^{-3}$ by previously implanting ions before crystal growth. Each of the Si buffer layer, SiC film, and SiGe film that have been epitaxially grown by the UHV-CVD processes is an undoped layer that is not doped with an impurity in the as-grown state.

Figure 14A:
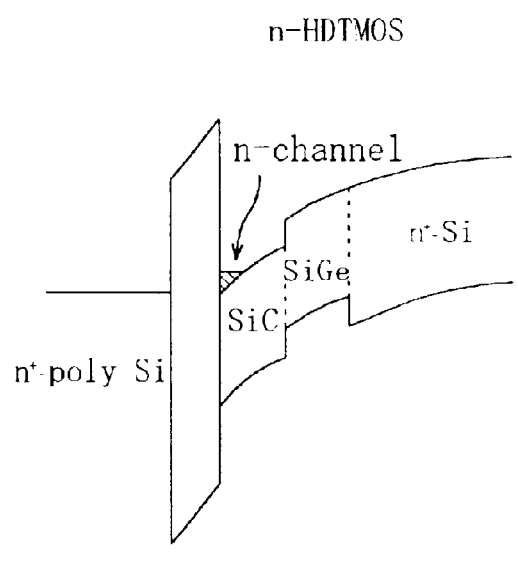
FIGS. 14(a) and 14(b) are energy band diagrams showing built-in potentials at the SiC/SiGe/Si heterojunction portions in the n- and p-HDTMOS devices, respectively.
Figure 14B:
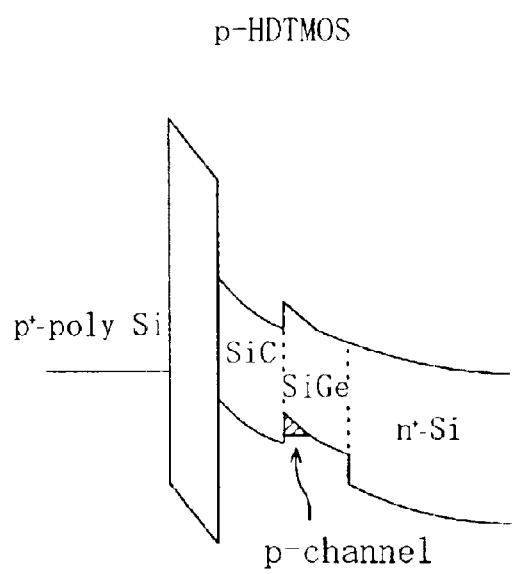

FIGS. 14(a) and 14(b) are energy band diagrams showing built-in potentials at the SiC/SiGe/Si heterojunction portions in the n- and p-HDTMOS devices, respectively. As shown in FIG. 14(a), in the n-HDTMOS device, a large band offset (a heterobarrier) is formed at the conduction band edge of the SiC/SiGe heterojunction portion in the SiC n-channel region. Thus, the SiC layer can be used as a channel region for the n-channel. As shown in FIG. 14(b), a large band offset (a heterobarrier) is formed at the valence band edge of the SiC/SiGe heterojunction portion in the SiGe p-channel region. Thus, the SiGe layer can be used as a channel region for the p-channel. By thus using the heterojunction structure in which the band offset (the height of the heterobarrier) rises to a maximum value with respect to electrons and holes, the properties of the heterojunction are fully brought out for each n- and p-channel as follows.

As compared with a DTMOS device having a Si homostructure, the HDTMOS device uses a semiconductor layer, having a band gap smaller than that of the substrate, for a channel so that the range of the operating voltage can be enlarged by reducing the threshold voltage. That is to say, since carriers are accumulated in a potential well formed by the heterobarrier also in a low electric field state, the threshold voltage can be reduced, thus allowing enhancement of the impurity concentration in the body region. The enhanced impurity concentration in the body region reduces the body resistance so that the CR delay is suppressed and high-speed operation is realized. The enhanced impurity concentration in the body region can also suppress the short channel effect.

This embodiment is characterized in that no Si cap layer is provided on the SiC layer in any of the n- and p-HDTMOS devices. Thus, in addition to the above-described advantages of the DTMOS devices, the following particular effects are exhibited.

First, in the n-HDTMOS device, the heterobarrier is formed in the conduction band which is advantageous in confining electrons therein. Thus, the threshold voltage can be reduced, as compared to a normal transistor made of only Si, so that a wide range of the operating voltage is secured. Since no Si cap layer is present in this structure, the SiC n-channel layer is a surface channel. As a result, no parasitic channel, which is a problem in a general MOS with a heterostructure, is created in the n-HDTMOS device.

Next, in the p-HDTMOS device, the beterobarrier is formed in the valence band which is advantageous in confining holes therein. Thus, the threshold voltage can be reduced, as compared to a normal transistor made of only Si, so that a wide range of the operating voltage is secured.

Hereinafter, the difference in transistor characteristics of HDTMOS devices between a case where a Si cap layer is provided on a SiC or SiGe layer and a case where no Si cap layer is provided as in the present invention will be described.

Figures 19A, 19B:
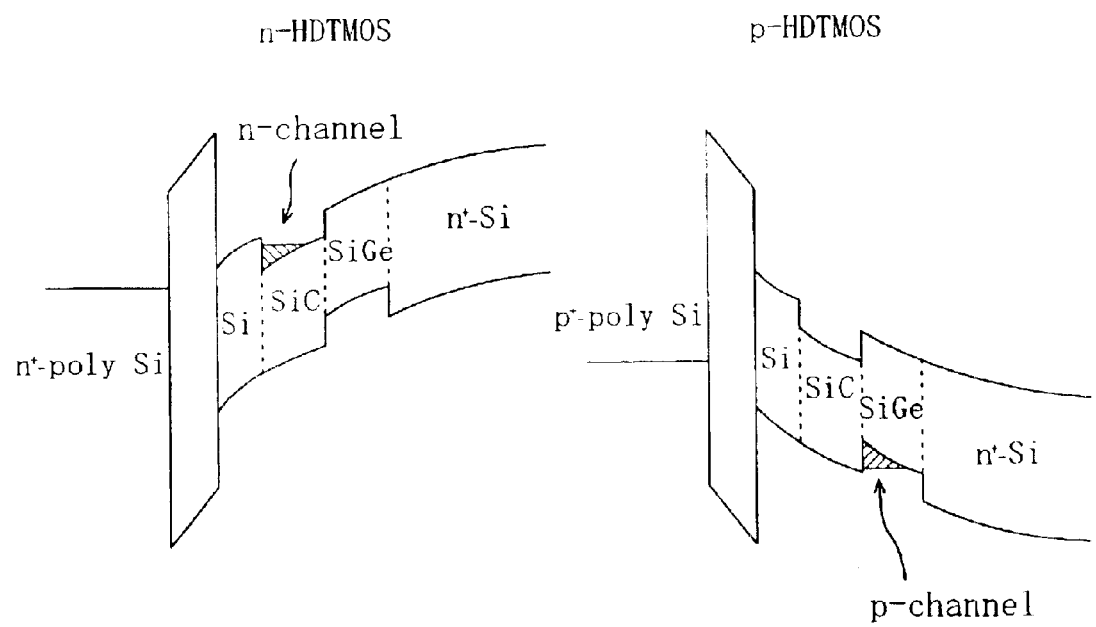
FIGS. 19(a) and 19(b) are energy band diagrams showing built-in potentials at the Si/SiC/SiGe/Si heterojunction portions in respective n- and p-HDTMOS devices in which a Si cap layer is provided to the c-HDTMOS device of the sixth embodiment.

FIGS. 19(a) and 19(b) are energy band diagrams showing built-in potentials at the Si/SiC/SiGe/Si heterojunction portions in respective n- and p-HDTMOS devices in which a Si cap layer is provided to the c-HDTMOS device of this embodiment. As shown in FIG. 19(a), in the DTMOS device with the heterostructure in which the Si cap layer is provided on the SiC layer, the n-channel is a buried channel formed under the Si cap layer. Thus, device characteristics greatly depend on the thickness of the Si cap layer.

Figure 20:
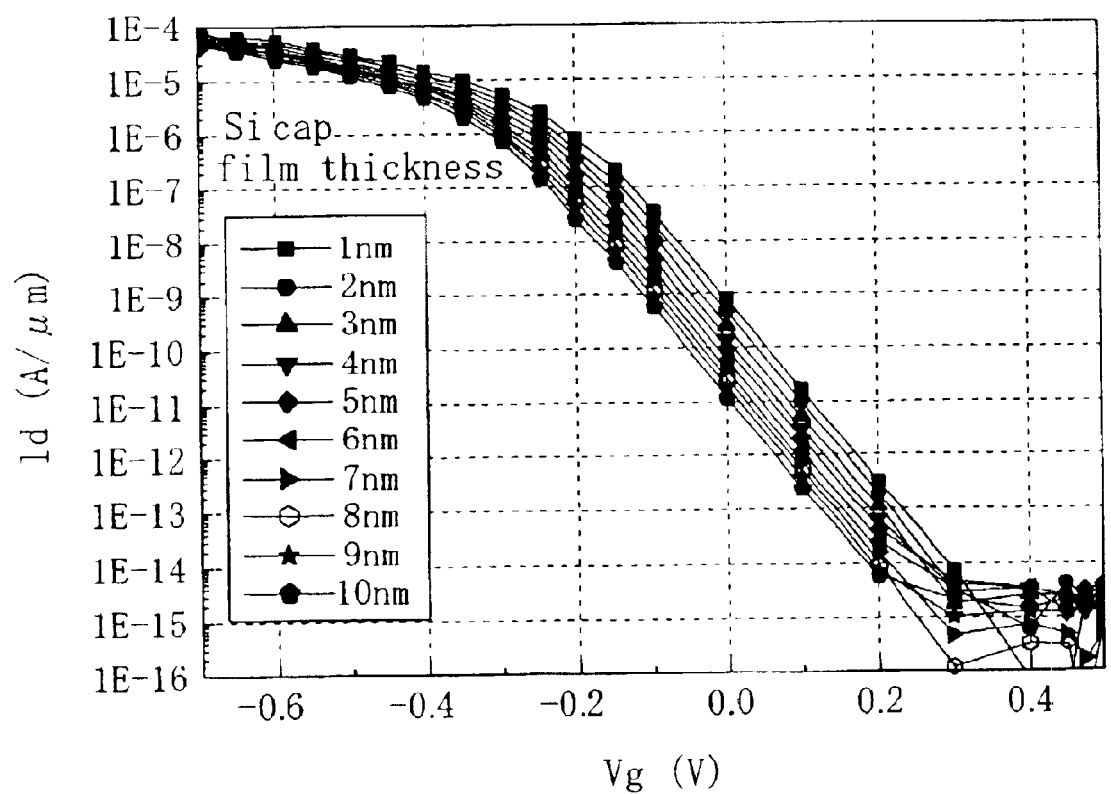
FIG. 20 is a graph showing Vg-Id characteristics when the thickness of the Si cap layer varies from 1 to 10 nm in a DTMOS device with a Si/SiGe heterostructure in which the p-channel is composed of SiGe.
Figure 21:
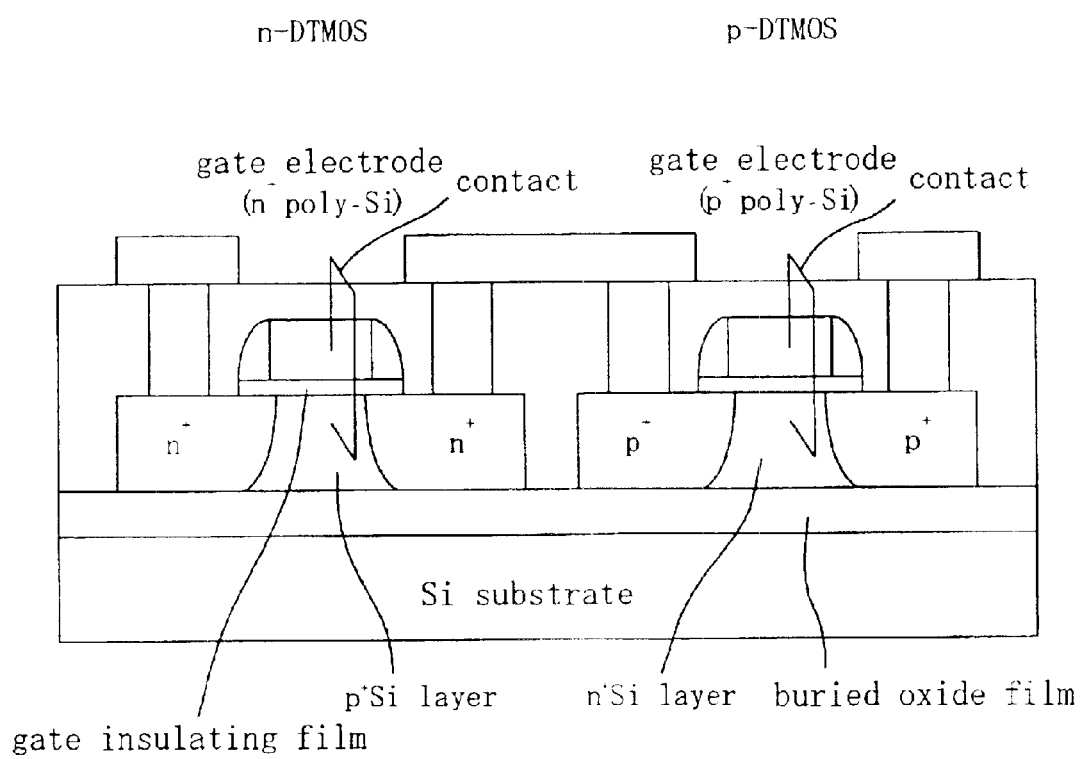
FIG. 21 is a cross-sectional view showing a structure of the known DTMOS device proposed in a literature.

FIG. 20 is a graph showing Vg-Id characteristics when the thickness of the Si cap layer varies from 1 to 10 nm in a DTMOS device with a Si/SiGe heterostructure in which the p-channel is composed of SiGe. As shown in FIG. 20, as the thickness of the Si cap layer increases, the threshold voltage increases. The same is also applicable to a DTMOS with a heterostructure in which SiC is used for the n-channel layer. This is because increase in thickness of the Si cap layer has the channel layer, in which carriers are accumulated, located away from the gate electrode, so that variation in potential at the gate electrode is less transmitted to the channel layer. If the thickness of the Si cap layer further increases, a parasitic channel formed at the interface between the Si cap layer and the gate oxide film becomes dominant. Thus, the threshold voltage of the DTMOS device with a heterojunction (the HDTMOS device) becomes equal to the threshold voltage of the DTMOS device using only a Si layer, thus arising a problem of losing the advantages obtained by adopting the heterojunction structure. Accordingly, to obtain the advantages of the heterojunction structure, the Si cap layer is preferably made as thin as possible.

However, the thickness of the Si cap layer is reduced during the formation of a thermal oxide film made of $SiO_2$ or during cleaning in a fabrication process. Thus, it is necessary to keep a margin for the thickness in consideration of reduction in film thickness during the processing. For example, if the gate insulating film is a thermal oxide film of $SiO_2$ with a thickness of 8 nm, 3.6 nm, i.e., 45% of 8 nm, of the Si cap layer is consumed. During the cleaning process, about 1 nm of the Si cap layer is consumed, depending on the concentration of a chemical solution and temperature. In a case where the Si cap layer is too thin and thermal oxidation reaches the SiC and SiGe channels during the formation of the thermal oxidation film, reliability in properties such as insulating property and breakdown voltage of SiC and SiGe thermal oxide films becomes lower than in a Si thermal oxide film, and this becomes a factor for gate leakage current and variation in the threshold voltage.

Therefore, although the Si cap layer needs to be as thin as possible, it is necessary to keep a margin for processing, in reality. However, since a thermal oxide film is also used as a passivation film as well as the gate insulating film, a plurality of thermal oxide processes are performed. In addition, a plurality of cleaning processes are also required. Therefore, it is difficult to set a margin for processing the Si cap layer, and actually, it is extremely difficult to properly control the thickness of the Si cap layer. In addition to variation in consumption of the Si cap layer created through the processes, the film thickness after deposition also varies. This variation in the Si cap layer becomes a cause of variation in device characteristics in the wafer plane or among wafers.

As shown in FIGS. 19(a) and 19(b), fabrication of a complementary field-effect transistor using a DTMOS device with a heterostructure provides a three-layered structure made of n-channel, p-channel and cap layers, and thus the thicknesses of these layers need to be properly controlled. This causes a problem of complicating design and production.

On the other hand, this embodiment provides a structure in which no Si cap layer is used, so that fabrication is easy and, in addition, there is no variation in device characteristics due to variation in thickness of the cap layer as described above.

In this embodiment, the DTMOS device is formed on the SOI substrate. However, if a bulk substrate is used instead of the SOI substrate, the same effects are naturally obtained.

In this embodiment, $SiO_2$ is used for the gate insulating film. Alternatively, materials having dielectric constants higher than that of $SiO_2$ may be used. Examples of the high-dielectric-constant material include SiON, $Si_3N_4$, $ZrO_2$, $HfO_2$, $Ta_2O_5$, PZT(Pb(Zr, Ti)$O_3$), PLZT((Pb, La)(Zr, Ti)$O_3$), SBT (SrBi$_2$Ta$_2$O$_9$), (SrBi$_2$(Nb, Ta)$_2$O$_9$), STO (SrTiO$_3$), BTO(BaTiO$_3$), BST((Ba, Sr)TiO$_3$)PZT, PLZT, SBT, (SrBi$_2$(Nb, Ta)$_2$O$_9$), STO(SrTiO$_3$), BTO(BaTiO$_3$), BIT (Bi$_4$Ti$_3$O$_{12}$), and BST((Ba, Sr)TiO$_3$). The use of such high-dielectric-constant materials ensures high driving force and reduction in the threshold voltage, thus exhibiting remarkable effects.

After the gate insulating film of the high-dielectric-constant material such as SiON, $Si_3N_4$, $ZrO_2$, $HfO_2$, $Ta_2O_5$, PZT(Pb(Zr, Ti)$O_3$), PLZT((Pb, La)(Zr, Ti)$O_3$), SBT (SrBi$_2$Ta$_2$O$_9$), (SrBi$_2$(Nb, Ta)$_2$O$_9$), STO(SrTiO$_3$), BTO (BaTiO$_3$), BST((Ba, Sr)TiO$_3$)PZT, PLZT, SBT, (SrBi$_2$(Na, Ta)$_2$O$_9$), STO(SrTiO$_3$), BTO(BaTiO$_3$), BIT(Bi$_4$Ti$_3$O$_{12}$), or BST((Ba, Sr)TiO$_3$) has been deposited with a process such as CVD or sputtering, the gate insulating film is irradiated with an EHF wave as described in the first through fifth embodiments. Then, the gate insulating film exhibits an excellent leakage property and an excellent dielectric property.

In the foregoing, a case where SiC and SiGe are used as materials for a channel forming a heterojunction with respect to a body region has been described as an example. However, if other semiconductor materials are used for forming a heterojunction, the same effects can also be obtained.

Embodiment 7

In this embodiment, a seventh embodiment which is an example of a complementary HDTMOS device with a SiGe/SiC/Si heterojunction, will be described. In this embodiment, a channel region for a p-channel is made of a SiGe/SiC heterojunction portion, and a channel region for an n-channel is made of a SiC/Si heterojunction portion.

Figure 15:
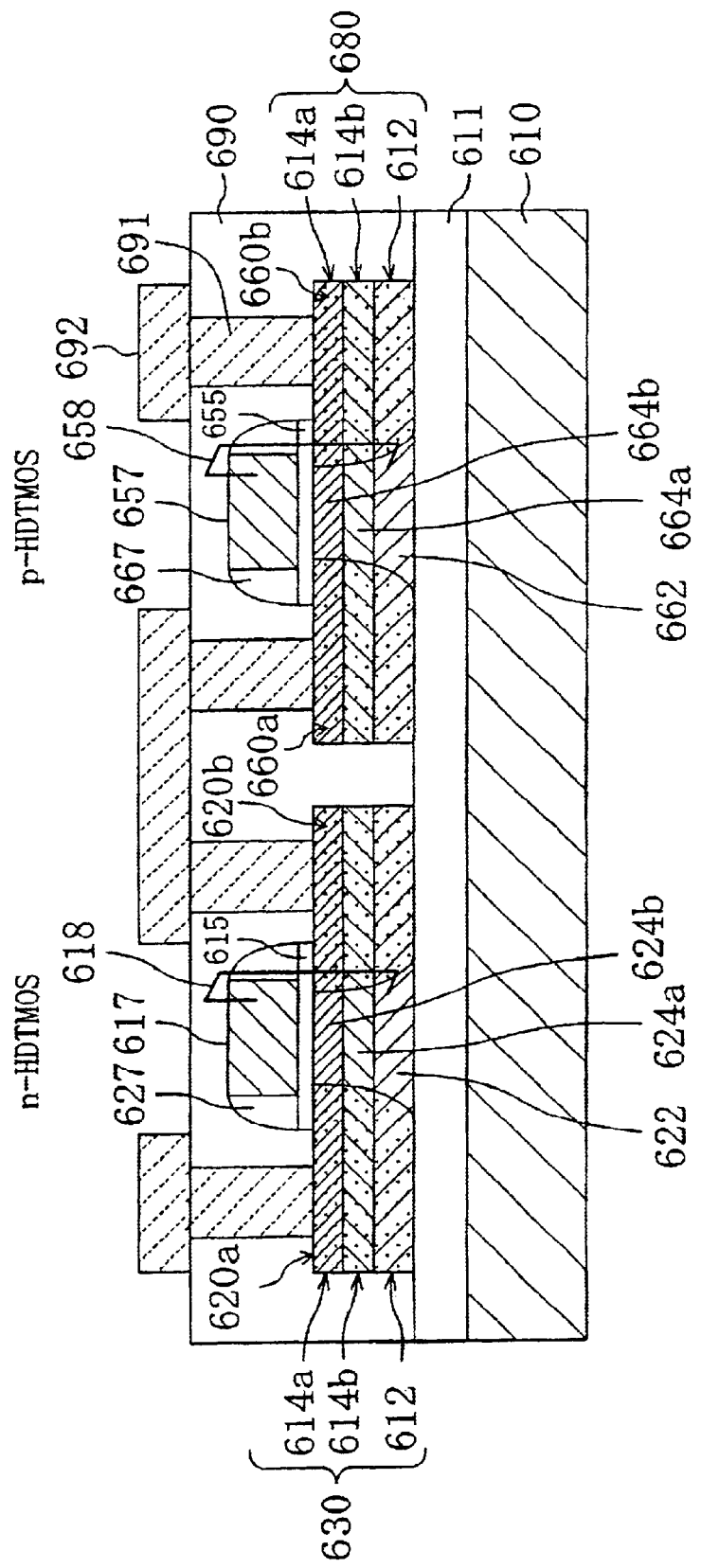
FIG. 15 is a cross-sectional view showing a structure of a complementary HDTMOS device according to a seventh embodiment of the present invention.

FIG. 15 is a cross-sectional view showing a structure of a complementary HDTMOS device according to this embodiment. As shown in FIG. 15, the c-HDTMOS device of this embodiment is different from that of the sixth embodiment only in that the vertical position of the SiC film 614b relative to the SiGe film 614a is inverted.

That is to say, in this embodiment, a semiconductor layer 630 for an n-channel HDTMOS device (an n-HDTMOS device) and a semiconductor layer 680 for a p-channel HDTMOS device (a p-HDTMOS device) are provided on an SOI substrate, and the semiconductor layers 630 and 680 are made of an identical film, i.e., are formed at the same time, as in the sixth embodiment.

Each of the semiconductor layers 630 and 680 includes: an upper Si film 612 constituting the upper portion of the SOI substrate; a SiC ($Si_{1-y}C_y$: y≈0.020) film 614b epitaxially grown on the upper Si film 612 by an UHV-CVD process; and a SiGe ($Si_{1-x}Ge_x$: x=0.40) film 614a epitaxially grown on the SiC film 614b by an UHV-CVD process. In this case, the thicknesses of the buried oxide film 611, upper Si film 612, SiGe film 614a and SiC film 614b are about 100 nm, about 100 nm, about 10 nm and about 10 nm, respectively.

The n-HDTMOS device further includes: gate insulating film 616; gate electrode 617; source/drain regions 620a and 620b; Si body region 622; contact 618; and sidewall 627, which are substantially the same as those of the sixth embodiment. Parts of the SiGe film 614a and the SiC film 614b located between the source/drain regions 620a and 620b are a SiGe p-channel region 624a and a SiC n-channel region 624b, respectively, which are undoped layers containing a p-type impurity at a relatively low concentration.

The p-HDTMOS device further includes: gate insulating film 656; gate electrode 657; source/drain regions 660a and 660b; Si body region 662; contact 658; and sidewall 667, which are substantially the same as those of the sixth embodiment. Parts of the SiGe film 614a and the SiC film 614b located between the source/drain regions 660a and 660b are a SiC n-channel region 664a and a SiGe p-channel region 664b, respectively, which are undoped layers containing an n-type impurity at a relatively low concentration.

Process steps for fabricating the complementary HDTMOS device of this embodiment are basically the same as those for fabricating the complementary HDTMOS device of the sixth embodiment.

FIGS. 16(a) and 16(b) are energy band diagrams showing built-in potentials at the SiGe/SiC/Si heterojunction portions in the n- and p-HDTMOS devices, respectively. As shown in FIG. 6(a), in the n-HDTMOS device, a large band offset (a heterobarrier) is formed at the conduction band edge of the SiGe/SiC heterojunction portion in the SiC n-channel region. Thus, the SiC layer can be used as a channel region for the n-channel. As shown in FIG. 6(b), a large band offset (a heterobarrier) is formed at the valence band edge of the SiGe/SiC heterojunction portion in the SiGe p-channel region. Thus, the SiGe layer can be used as a channel region for the p-channel. By thus using the heterojunction structure in which the band offset (the height of the heterobarrier) rises to a maximum value with respect to electrons and holes, the properties of the heterojunction are fully brought out for each n- and p-channel as follows.

As compared with a DTMOS device having a Si homostructure, the threshold voltage is reduced, thus allowing enhancement of the impurity concentration in the body region, as in the sixth embodiment. The enhanced impurity concentration in the body region reduces the body resistance so that the CR delay is suppressed and high-speed operation is realized. The enhanced impurity concentration in the body region can also suppress the short channel effect.

In this embodiment, since no Si cap layer is provided on the SiGe layer in any of the n- and p-HDTMOS devices, the SiGe p-channel layer is a surface channel. As a result, no parasitic channel, which is a problem in a general MOS with a heterostructure, is created in the p-HDTMOS device.

In the n-HDTMOS device, the heterobarrier is also formed in the conduction band which is advantageous in confining electrons therein. Thus, the threshold voltage can be reduced, as compared to a normal transistor made of only Si, so that a wide range of the operating voltage is secured.

Since this embodiment provides a structure in which no Si cap layer is used, so that fabrication is easy and, in addition, there is no variation in device characteristics due to variation in thickness of the cap layer.

In this embodiment, the DTMOS device is formed on the SOI substrate. However, if a bulk substrate is used instead of the SOI substrate, the same effects are naturally obtained.

In this embodiment, $SiO_2$ is used for the gate insulating film. Alternatively, materials having dielectric constants higher than that of $SiO_2$ may be used. Examples of the high-dielectric-constant material include SiON, $Si_3N_4$, $ZrO_2$, $HfO_2$ and $Ta_2O_5$. The use of such high-dielectric-constant materials ensures high driving force and reduction in the threshold voltage, thus exhibiting remarkable effects.

After the gate insulating film of the high-dielectric-constant material such as $SiO_2$, SiON, $Si_3N_4$, $ZrO_2$, $HfO_2$, or $Ta_2O_5$ has been deposited with a process such as CVD or sputtering, the gate insulating film is irradiated with an EHF wave as described in the first through fifth embodiments. Then, the gate insulating film exhibits an excellent leakage property and an excellent dielectric property.

In the foregoing, a case where SiC and SiGe are used as materials for a channel forming a heterojunction with respect to a body region has been described as an example. However, if other semiconductor materials are used for forming a heterojunction, the same effects can also be obtained.

Embodiment 8

Next, an eight embodiment of the present invention, which is an example of a complementary HDTMOS device with a channel region made of $SiGeC(Si_{1-x-y}Ge_xC_y)$ will be described.

Figure 17:
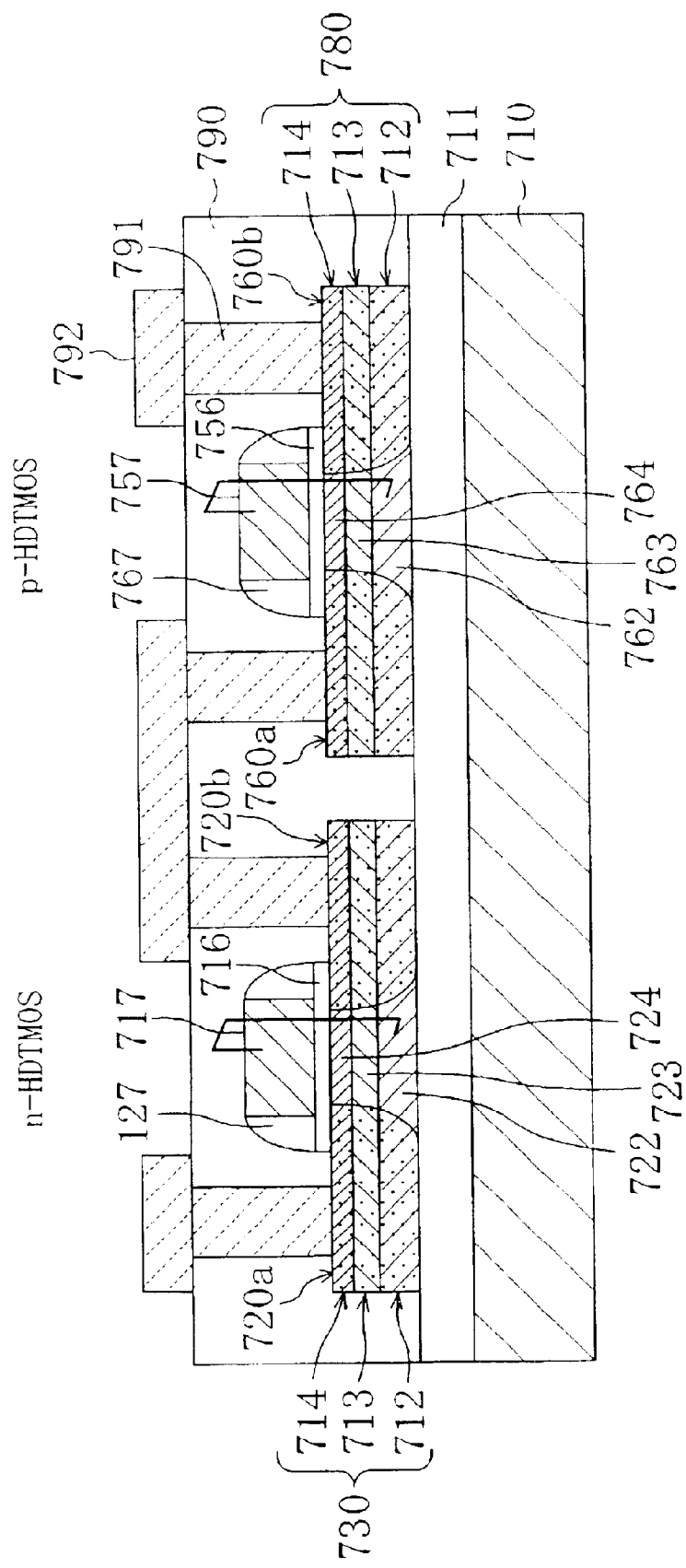
FIG. 17 is a cross-sectional view showing a structure of an HDTMOS device according to an eighth embodiment of the present invention.

FIG. 17 is a cross-sectional view showing a structure of a HDTMOS device according to this embodiment. As shown in FIG. 17, the HDTMOS device of this embodiment includes: a p-type substrate 710; a buried oxide film 711 defined by a process such as implanting oxygen ions into the Si substrate; a semiconductor layer 730 for an n-channel HDTMOS device (an n-HDTMOS device) provided on the buried oxide film 711; and a semiconductor layer 780 for a p-channel HDTMOS device (a p-HDTMOS device) provided on the buried oxide film 711. The semiconductor layers 730 and 780 are made of an identical film, i.e., are formed at the same time.

Each of the semiconductor layers 730 and 780 includes: an upper Si film 712 constituting the upper portion of the SOI substrate; a Si buffer layer 713 epitaxially grown on the upper Si film 712 by an UHV-CVD process; and a SiGeC ($Si_{1-x-y}Ge_xC_y$: x=0.2, y=0.04) film 714a epitaxially grown on the Si buffer layer 713 by an UHV-CVD process. In this case, the thicknesses of the buried oxide film 711, upper Si film 712, Si buffer layer 713 and SiGeC film 714 are about 100 nm, about 100 nm, about 10 nm and about 15 nm, respectively.

The n-HDTMOS device further includes: a gate insulating film 716 made of a silicon oxide film on a Si film 715; and a gate electrode 717 of polysilicon formed on the gate insulating film 716 and containing an n-type impurity at a high concentration. In parts of the semiconductor layer 730 that are located to both sides of the gate electrode 717, source/drain regions 720a and 720b containing an n-type impurity at a high concentration are provided. Part of the upper Si film 712 located between the source/drain regions 720a and 720b is a Si body region 722 containing a p-type impurity at a high concentration (about $1\times10^{19}$ atoms·cm$^{-3}$). Part of the Si buffer layer 713 located directly over the Si body region 722 is a p$^-$ Si region 723 containing a p-type impurity at a low concentration. Part of the SiGeC film 714 located between the source/drain regions 720a and 720b is a SiGeC channel region 724 that is an undoped layer containing a p-type impurity at a low concentration. A contact 718 as a conductor member for electrically connecting the gate electrode 717 and the Si body region 722 is provided. A sidewall 727 of a silicon oxide film is provided on the sides of the gate electrode 717.

The p-HDTMOS device further includes: a gate insulating film 756 made of a silicon oxide film on a Si film 715; and a gate electrode 757 formed on the gate insulating film 756 and containing a p-type impurity at a high concentration. In parts of the semiconductor layer 780 that are located to both sides of the gate electrode 757, source/drain regions 760a and 760b containing a p-type impurity at a high concentration are provided. Part of the upper Si film 712 located between the source/drain regions 760a and 760b is a Si body region 762 containing an n-type impurity at a high concentration (about $1\times10^{19}$ atoms·cm$^{-3}$). Part of the Si buffer layer 713 located directly over the Si body region 762 is an n$^-$ Si region 726 containing an n-type impurity at a low concentration. Part of the SiGeC film 714 located between the source/drain regions 760a and 760b is a SiGeC channel region 764 that is an undoped layer and contains an n-type impurity at a low concentration. A contact 758 as a conductor member for electrically connecting the gate electrode 757 and the Si body region 762 is provided. A sidewall 767 of a silicon oxide film is provided on the sides of the gate electrode 757.

Over the substrate, an interlevel dielectric film 790, contacts 791 that are respectively in contact with the source/drain regions 720a, 720b, 760a and 760b through the interlevel dielectric film 790, and source/drain electrodes 792 connected to the contacts 791 and extending on the interlevel dielectric film 790 are provided.

In a process for fabricating the complementary HDTMOS device of this embodiment, the upper Si film, which is part of the SOI substrate, includes a p$^+$ Si layer (an n-HDTMOS device region) and an n$^+$ Si layer (a p-HDTMOS device region), doped with an impurity at a concentration of about $1\times10^{19}$ atoms·cm$^{-3}$ by previously implanting ions before crystal growth. Each of the Si buffer layer and the SiGeC film that have been epitaxially grown by the UHV-CVD process is an undoped layer that is not doped with an impurity in the as-grown state. A silicon oxide film is deposited over the SiGeC film with a CVD process and serves as a gate insulating film. On the gate insulating film, an n$^+$-type gate electrode of polysilicon doped with an n-type impurity at a high concentration and a p$^+$-type gate electrode of polysilicon doped with a p-type impurity at a high concentration are formed. Thereafter, below each of the gate electrodes, an n$^+$-type source/drain regions doped with an n-type impurity at a high concentration and a p$^+$-type source/drain regions doped with a p-type impurity at a high concentration are defined to sandwich the gate electrode therewith. Source/drain electrodes are fanned over the respective source/drain regions. Each of the gate electrodes is connected to the corresponding Si body region via the contact. In this manner, an HDTMOS device structure is obtained.

Figure 18A:
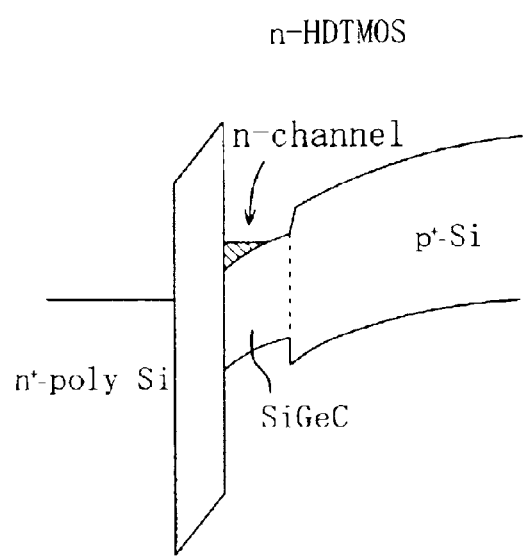
FIGS. 18(a) and 18(b) are energy band diagrams showing built-in potentials at the SiGeC/Si heterojunction portions in the n- and p-HDTMOS devices, respectively.
Figure 18B:
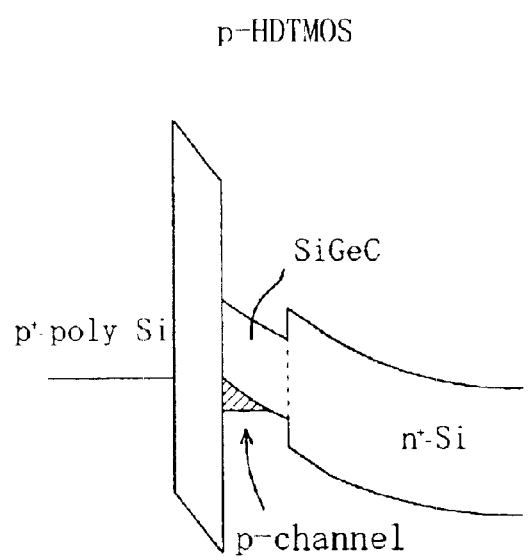

FIGS. 18(a) and 18(b) are energy band diagrams showing built-in potentials at the SiGeC/Si heterojunction portions in the n- and p-HDTMOS devices, respectively. As shown in FIG. 18(a), in the n-HDTMOS device, a large band offset (a heterobarrier) is formed at the conduction band edge of the SiGeC/Si heterojunction portion in the SiGeC channel region. Thus, the SiGeC layer can be used as a channel region for the n-channel. As shown in FIG. 18(b), a large band offset (a heterobarrier) is also formed at the valence band edge of the SiGeC/Si heterojunction portion in the SiGeC channel region. Thus, the SiGeC layer can be used as a channel region for the p-channel. By thus using the heterojunction structure in which the band offset (the height of the heterobarrier) rises to a maximum value with respect to electrons and holes, the properties of the heterojunction are fully brought out for each n- and p-channel as follows. That is to say, in the SiGeC(Si$_{1-x-y}$Ge$_x$C$_y$)/Si heterojunction portion, if the mole fractions of Ge and C, i.e., x and y, are properly adjusted, a band offset (a heterobarrier) is formed at each of the conduction and valence band edges. Thus, the use of a single SiGeC(Si$_{1-x-y}$Ge$_x$C$_y$) layer enables the formation of an n-channel where electrons are confined in the SiGeC layer to flow therein and a p-channel where holes are confined in the SiGeC layer to flow therein.

In this embodiment, the channel region is made of SiGeC (Si$_{1-x-y}$Ge$_x$C$_y$). Thus, it is possible to form an n-channel where electrons are confined in the SiGeC layer to flow therein and a p-channel where holes are confined in the SiGeC layer to flow therein, thus, implementing a complementary HDTMOS device having a SiGeC/Si heterojunction.

As compared with a DTMOS device having a Si homostructure, the HDTMOS device uses a semiconductor layer, having a band gap smaller than that of the substrate, for a channel so that the range of the operating voltage can be enlarged by reducing the threshold voltage, as in the sixth and seventh embodiments. That is to say, since carriers are accumulated in a potential well formed by the heterobarrier also in a low electric field state, the threshold voltage can be reduced, thus allowing enhancement of the impurity concentration in the body region. The enhanced impurity concentration in the body region reduces the body resistance so that the CR delay is suppressed and high-speed operation is realized. The enhanced impurity concentration in the body region can also suppress the short channel effect.

This embodiment is characterized in that no Si cap layer is provided on the SiGeC layer in any of the n- and p-HDTMOS devices. Thus, in addition to the advantages of the DTMOS devices as described above, the following particular effects are exhibited.

First, in the n-HDTMOS device, a heterobarrier that is advantageous for confining electrons is formed in the conduction band, while in the p-HDTMOS device, a heterobarrier that is advantageous for confining holes is formed in the valence band. Thus, the threshold voltage can be reduced, as compared to a normal transistor made of only Si, so that a wide range of the operating voltage is secured.

Since no Si cap layer is present in this structure, each of the SiGeC n-channel layer and the SiGeC p-channel layer is a surface channel. As a result, no parasitic channel, which is a problem in a general MOS with a heterostructure, is created in both of the n- and p-HDTMOS devices. As a result, a transistor with high current-driving capability is implemented.

This embodiment provides a structure in which no Si cap layer is used, so that fabrication is easy and, in addition, there is no variation in device characteristics due to variation in thickness of the cap layer.

In this embodiment, the DTMOS device is formed on the SOI substrate. However, if a bulk substrate is used instead of the SOI substrate, the same effects are naturally obtained.

In this embodiment, SiO$_2$ is used for the gate insulating film. Alternatively, materials having dielectric constants higher than that of SiO$_2$ may be used. Examples of the high-dielectric-constant material include SiON, Si$_3$N$_4$, ZrO$_2$, HfO$_2$ and Ta$_2$O$_5$. The use of such high-dielectric-constant materials ensures high driving force and reduction in the threshold voltage. That is to say, the use of the high-dielectric constant material makes the curve of the built-in potential steeper. Thus, the threshold voltage can be reduced and the difference between the drain current and the body current is further enlarged. Accordingly, even if the impurity concentration in the body region is increased, it is possible to set the threshold voltage to a value substantially equal to that of a MOS transistor made of only Si. As a result, in the HDTMOS device of this embodiment, the body resistance is reduced and the potential at the body region is effectively transmitted to the channel region so that the operating speed is less limited by a CR delay.

After the gate insulating film of the high-dielectric-constant material such as SiO$_2$, SiON, Si$_3$N$_4$, ZrO$_2$, HfO$_2$, and Ta$_2$O$_5$ has been deposited with a process such as CVD or sputtering, the gate insulating film is irradiated with an EHF wave as described in the first through fifth embodiments. Then, the gate insulating film exhibits an excellent leakage property and an excellent dielectric property.

In the foregoing, a case where SiGeC is used as a material for a channel forming a heterojunction with respect to a body region has been described. However, if other semiconductor materials are used for forming a heterojunction, the same effects can also be obtained.

Other Embodiment

In the third and sixth thorough eighth embodiments, examples in which a capacitor including a dielectric film (especially a ferroelectric or high-dielectric-constant film) to be irradiated with an inventive EHF wave as a capacitive film is provided in a ferroelectric memory or a MISFET have been described. However, the present invention is not limited to these embodiments. For example, a dielectric film subjected to an inventive EHF wave may be used as a capacitive film intervening between the storage node and the cell plate of a DRAM, a capacitive film intervening between the floating gate and the control gate of a ROM, particularly a flash memory, or a capacitive film for a capacitor such as a MIS capacitor or a MIM capacitor.

INDUSTRIAL APPLICABILITY

The present invention is applicable to semiconductor devices such as ferroelectric memories, DRAMs, memory devices such as flash memories, MIS capacitors, MIM capacitors, MISFETs, CMOS devices with Si/SiGe heterojunction, and CMOS devices with Si/SiGeC heterojunction.

What is claimed is:

1. A semiconductor device, comprising:

a substrate;

a semiconductor layer provided in part of the substrate;

a gate insulating film provided on the semiconductor layer;

a gate electrode provided on the gate insulating film;

source/drain regions of a first conductivity type defined in the semiconductor layer each to a side of the gate electrode;

a channel region for carriers of the first conductivity type defined in the semiconductor layer between the source/drain regions of the first conductivity type;

a body region of a second conductivity type that is defined in the semiconductor layer under the channel region for carriers of the first conductivity type and has a potential higher than that in the channel region for carriers of the first conductivity type with respect to carriers in a band edge where carriers flow;

a conductor member for electrically connecting the gate electrode and the body region of the second conductivity type, wherein the channel region for carriers of the first conductivity type is in direct contact with the gate insulating film;

a channel region for carriers of the second conductivity type provided between the channel region for carriers of the first conductivity type and the body region of the second conductivity type;

another semiconductor layer provided on the substrate;

another gate insulating film provided on said another semiconductor layer;

another gate electrode provided on said another gate insulating film;

source/drain regions of the second conductivity type defined in said another semiconductor layer each to a side of said another gate electrode;

a channel region for carriers of the first conductivity type defined in said another semiconductor layer between the source/drain regions of the second conductivity type;

a channel region for carriers of the second conductivity type defined in said another semiconductor layer between said another gate insulating film and the channel region for carriers of the first conductivity type;

a body region of the first conductivity type that is defined in said another semiconductor layer under the channel region for carriers of the first conductivity type and has a potential higher than that in the channel region for carriers of the first conductivity type, with respect to carriers in a band edge where carriers flow; and another conductor member for electrically connecting said another gate electrode and the body region of the first conductivity type, wherein the semiconductor device functions as a complementary device, the body region in each of the semiconductor layers is made of Si, the channel region for carriers of the first conductivity type in the semiconductor layer is made of $Si_{1-y}C_y$ ($y \neq 0$), the channel region for carriers of the second conductivity type in the semiconductor layer is made of $Si_{1-x}Ge_x$ ($x \neq 0$), the channel region for carriers of the first conductivity type in the semiconductor layer functions as an n-channel where electrons flow, the channel region for carriers of the first conductivity type in said another semiconductor layer is made of $Si_{1-x}Ge_x$, the channel region for carriers of the second conductivity type in said another semiconductor layer is made of $Si_{1-y}C_y$, and the channel region for carriers of the first conductivity type in said another semiconductor layer functions as a p-channel where holes flow.

2. The semiconductor device of claim 1, wherein the gate insulating film is made of at least one material selected from the group consisting of SiON, $Si_3N_4$, $ZrO_2$, $HfO_2$, $Ta_2O_5$, PZT(Pb(Zr, Ti)$O_3$), PLZT((Pb, La)(Zr, Ti)$O_3$), SBT (SrBi$_2$Ta$_2$O$_9$), (SrBi$_2$(Nb, Ta)$_2$O$_9$), STO(SrTiO$_3$), BTO (BaTiO$_3$), BST((Ba, Sr)TiO$_3$)PZT, PLZT, SBT, BST((Ba, Sr)TiO$_3$), and BIT(Bi$_4$Ti$_3$O$_{12}$).

3. The semiconductor device of claim 2, wherein the gate insulating film has been subjected to irradiation with an electromagnetic wave in the frequency range from 1 GHz to 100 GHz, both inclusive.

4. The semiconductor device of claim 1, wherein the semiconductor substrate is an SOI substrate.

5. The semiconductor device of claim 1, wherein $0 < x \leq 0.4$ and $0 < y \leq 0.03$.

6. A semiconductor device, comprising:

a substrate;

a semiconductor layer provided in part of the substrate;

a gate insulating film provided on the semiconductor layer;

a gate electrode provided on the gate insulating film;

source/drain regions of a first conductivity type defined in the semiconductor layer each to a side of the gate electrode;

a channel region for carriers of the first conductivity type defined in the semiconductor layer between the source/drain regions of the first conductivity type;

a body region of a second conductivity type that is defined in the semiconductor layer under the channel region for carriers of the first conductivity type and has a potential higher than that in the channel region for carriers of the first conductivity type with respect to carriers in a band edge where carriers flow;

a conductor member for electrically connecting the gate electrode and the body region of the second conductivity type, wherein the channel region for carriers of the first conductivity type is in direct contact with the gate insulating film;

a channel region for carriers of the second conductivity type provided between the channel region for carriers of the first conductivity type and the body region of the second conductivity type;

another semiconductor layer provided on the substrate;

another gate insulating film provided on said another semiconductor layer;

another gate electrode provided on said another gate insulating film;

source/drain regions of the second conductivity type defined in said another semiconductor layer each to a side of said another gate electrode;

a channel region for carriers of the first conductivity type defined in said another semiconductor layer between the source/drain regions of the second conductivity type;

a channel region for carriers of the second conductivity type defined in said another semiconductor layer between said another gate insulating film and the channel region for carriers of the first conductivity type;

a body region of the first conductivity type that is defined in said another semiconductor layer under the channel region for carriers of the first conductivity type and has a potential higher than that in the channel region for carriers of the first conductivity type, with respect to carriers in a band edge where carriers flow; and another conductor member for electrically connecting said another gate electrode and the body region of the first conductivity type, wherein the semiconductor device functions as a complementary device, the body region in each of the semiconductor layers is made of Si, the channel region for carriers of the first conductivity type in the semiconductor layer is made of $Si_{1-x}Ge_x$ ($x \neq 0$), the channel region for carriers of the second conductivity type in the semiconductor layer is made of $Si_{1-y}C_y$ ($y \neq 0$), the channel region for carriers of the first conductivity type in the semiconductor layer functions as an n-channel where electrons flow, the channel region for carriers of the first conductivity type in said another semiconductor layer is made of $Si_{1-y}Cy$, the channel region for carriers of the second conductivity type in said another semiconductor layer is made of $Si_{1-x}Ge_x$, and the channel region for carriers of the second conductivity type in the semiconductor layer functions as a p-channel where holes flow.

7. The semiconductor device of claim 6, wherein $0 < x \leq 0.4$ and $0 < y \leq 0.03$.

8. The semiconductor device of claim 6, wherein the gate insulating film is made of at least one material selected from the group consisting of SiON, $Si_3N_4$, $ZrO_2$, $HfO_2$, $Ta_2O_5$, PZT(Pb(Zr, Ti)$O_3$), PLZT (Pb, La)(Zr, Ti)$O_3$), SBT (SrBi$_2$Ta$_2$O$_9$), (SrBi$_2$(Nb, Ta)$_2$O$_9$), STO(SrTiO$_3$), BTO (BaTiO$_3$), BST((Ba, Sr)TiO$_3$)PZT, PLZT, SBT, BIT (Bi$_4$Ti$_3$O$_{12}$), and BST((Ba, Sr)TiO$_3$).

9. The semiconductor device of claim 8, wherein the gate insulating film has been subjected to irradiation with an electromagnetic wave in the frequency range from 1 GHz to 100 GHz, both inclusive.

10. The semiconductor device of claim 6, wherein the semiconductor substrate is an SOI substrate.

* * * * *

UNITED STATES PATENT AND TRADEMARK OFFICE
CERTIFICATE OF CORRECTION

PATENT NO. : 6,872,989 B2
DATED : March 29, 2005
INVENTOR(S) : Akira Inoue et al.

It is certified that error appears in the above-identified patent and that said Letters Patent is hereby corrected as shown below:

<u>Title page,</u>
Insert Item -- [30] Foreign Application Priority Data
    April 3, 2001 (JP)...............2001-104102
    May 21, 2001 (JP)...............2001-150719 --

Signed and Sealed this

Ninth Day of August, 2005

JON W. DUDAS
*Director of the United States Patent and Trademark Office*